(12) United States Patent
Seo et al.

(10) Patent No.: US 7,550,173 B2
(45) Date of Patent: Jun. 23, 2009

(54) LUMINESCENT DEVICE AND METHOD OF MANUFACTURING SAME

(75) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 104 days.

(21) Appl. No.: 11/069,235

(22) Filed: Mar. 2, 2005

(65) Prior Publication Data

US 2005/0170737 A1 Aug. 4, 2005

Related U.S. Application Data

(62) Division of application No. 10/043,786, filed on Jan. 10, 2002, now abandoned.

(30) Foreign Application Priority Data

Jan. 17, 2001 (JP) ............... 2001-009544

(51) Int. Cl.
B05D 5/06 (2006.01)
B05D 3/02 (2006.01)
B05D 1/02 (2006.01)

(52) U.S. Cl. .................... 427/66; 427/70; 427/384; 427/427.4

(58) Field of Classification Search ............. 427/66, 427/69, 427.5, 541, 70, 384, 427.4; 313/504, 313/506; 428/917; 445/24
See application file for complete search history.

(56) References Cited

U.S. PATENT DOCUMENTS

| | | |
|---|---|---|
| 3,654,525 A | 4/1972 | Maricle et al. |
| 4,725,513 A | 2/1988 | Eguchi et al. |
| 5,017,863 A | 5/1991 | Mellitz |
| 5,039,657 A | 8/1991 | Goldman et al. |
| 5,170,990 A | 12/1992 | Kamiya et al. |
| 5,256,945 A | 10/1993 | Imai et al. |
| 5,271,089 A | 12/1993 | Ozawa |

(Continued)

FOREIGN PATENT DOCUMENTS

EP 1 011 155 6/2000

(Continued)

OTHER PUBLICATIONS

Australian Patent Office Search Report (Application No. 200200365.5), Nov. 11, 2003, 11 pages.

(Continued)

*Primary Examiner*—Timothy H Meeks
*Assistant Examiner*—Jimmy Lin
(74) *Attorney, Agent, or Firm*—Fish & Richardson P.C.

(57) ABSTRACT

Disclosed are a luminescent device and electric appliance which have low power consumption and a long life. An organic luminescent element is provided by a scheme that a region 204b where the concentrations of first and second organic compounds change gradually is provided in the organic compound layer 203b, a region 201b where the first organic compound can express its function is formed, and a region 202b where the second organic compound can express its function is formed. Thereby the functions of the individual materials are allowed to express. This scheme provides an organic luminescent element which has low power consumption and a long life. A luminescent device and electric appliance are manufactured by using the organic luminescent element.

30 Claims, 19 Drawing Sheets

U.S. PATENT DOCUMENTS

| | | | |
|---|---|---|---|
| 5,281,489 A | 1/1994 | Mori et al. | |
| 5,486,406 A | 1/1996 | Shi | |
| 5,513,499 A | 5/1996 | deRijke | |
| 5,601,903 A * | 2/1997 | Fujii et al. | 428/212 |
| 5,674,597 A | 10/1997 | Fujii et al. | |
| 5,719,467 A | 2/1998 | Antoniadis et al. | |
| 5,817,431 A | 10/1998 | Shi et al. | |
| 5,853,905 A | 12/1998 | So et al. | |
| 5,858,563 A | 1/1999 | Sano et al. | |
| 5,895,692 A * | 4/1999 | Shirasaki et al. | 427/557 |
| 5,925,472 A | 7/1999 | Hu et al. | |
| 5,925,980 A * | 7/1999 | So et al. | 313/504 |
| 5,955,836 A | 9/1999 | Boerner et al. | |
| 5,989,737 A | 11/1999 | Xie et al. | |
| 6,030,715 A | 2/2000 | Thompson et al. | |
| 6,048,573 A * | 4/2000 | Tang et al. | 427/66 |
| 6,049,167 A * | 4/2000 | Onitsuka et al. | 313/512 |
| 6,097,147 A | 8/2000 | Baldo et al. | |
| 6,121,727 A | 9/2000 | Kanai et al. | |
| 6,130,001 A | 10/2000 | Shi et al. | |
| 6,132,280 A | 10/2000 | Tanabe et al. | |
| 6,150,668 A * | 11/2000 | Bao et al. | 257/40 |
| 6,215,462 B1 | 4/2001 | Yamada et al. | |
| 6,228,228 B1 | 5/2001 | Singh et al. | |
| 6,232,386 B1 * | 5/2001 | Vargo et al. | 524/434 |
| 6,237,529 B1 | 5/2001 | Spahn | |
| 6,275,649 B1 | 8/2001 | Nagashima et al. | |
| 6,284,050 B1 | 9/2001 | Shi et al. | |
| 6,285,039 B1 | 9/2001 | Kobori et al. | |
| 6,303,239 B1 | 10/2001 | Arai et al. | |
| 6,310,360 B1 | 10/2001 | Forrest et al. | |
| 6,326,091 B1 | 12/2001 | Schoo et al. | |
| 6,366,017 B1 | 4/2002 | Antoniadis et al. | |
| 6,368,730 B1 | 4/2002 | Kishimoto et al. | |
| 6,372,154 B1 | 4/2002 | Li | |
| 6,392,250 B1 | 5/2002 | Aziz et al. | |
| 6,392,339 B1 | 5/2002 | Aziz et al. | |
| 6,396,209 B1 | 5/2002 | Kido et al. | |
| 6,413,656 B1 | 7/2002 | Thompson et al. | |
| 6,432,255 B1 | 8/2002 | Sun et al. | |
| 6,458,475 B1 | 10/2002 | Adachi et al. | |
| 6,468,676 B1 | 10/2002 | Ueda et al. | |
| 6,495,198 B2 | 12/2002 | Peng | |
| 6,501,217 B2 | 12/2002 | Beierlein et al. | |
| 6,517,996 B1 | 2/2003 | Chao et al. | |
| 6,528,824 B2 | 3/2003 | Yamagata et al. | |
| 6,541,129 B1 | 4/2003 | Kawamura et al. | |
| 6,541,909 B1 | 4/2003 | Motomatsu | |
| 6,558,817 B1 | 5/2003 | Ueda et al. | |
| 6,566,807 B1 | 5/2003 | Fujita et al. | |
| 6,603,140 B2 | 8/2003 | Kobori et al. | |
| 6,614,175 B2 | 9/2003 | Aziz et al. | |
| 6,803,720 B2 | 10/2004 | Kwong et al. | |
| 6,821,553 B2 * | 11/2004 | Miyashita et al. | 427/66 |
| 6,831,406 B1 | 12/2004 | Fukuyama et al. | |
| 6,878,312 B1 | 4/2005 | Kanbe et al. | |
| 7,173,370 B2 | 2/2007 | Seo et al. | |
| 7,196,360 B2 | 3/2007 | Seo et al. | |
| 2001/0019782 A1 * | 9/2001 | Igarashi et al. | 428/690 |
| 2001/0043044 A1 | 11/2001 | Wakimoto et al. | |
| 2001/0051207 A1 | 12/2001 | Yamagata et al. | |
| 2002/0018912 A1 | 2/2002 | Jung et al. | |
| 2002/0038867 A1 | 4/2002 | Kobori et al. | |
| 2002/0074935 A1 | 6/2002 | Kwong et al. | |
| 2002/0081767 A1 | 6/2002 | Kawashima | |
| 2002/0086180 A1 | 7/2002 | Seo et al. | |
| 2002/0093283 A1 | 7/2002 | Seo et al. | |
| 2002/0101154 A1 | 8/2002 | Seo et al. | |
| 2002/0105005 A1 | 8/2002 | Seo et al. | |
| 2002/0109136 A1 | 8/2002 | Seo et al. | |
| 2002/0110941 A1 | 8/2002 | Yamazaki et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2003/0118950 A1 | 6/2003 | Chao et al. | |
| 2003/0132704 A1 | 7/2003 | Aziz et al. | |
| 2003/0134145 A1 | 7/2003 | Toguchi et al. | |
| 2003/0141810 A1 * | 7/2003 | Kobayashi et al. | 313/504 |
| 2005/0156148 A1 | 7/2005 | Kanbe et al. | |

FOREIGN PATENT DOCUMENTS

| | | |
|---|---|---|
| EP | 1 065 737 | 1/2001 |
| EP | 1 083 775 | 3/2001 |
| EP | 1 220 340 | 7/2002 |
| JP | 03-114197 | 5/1991 |
| JP | 03-190088 | 8/1991 |
| JP | 05-182762 | 7/1993 |
| JP | 07-169569 | 7/1995 |
| JP | 10-077467 | 3/1998 |
| JP | 10-162955 | 6/1998 |
| JP | 10-233288 | 9/1998 |
| JP | 11-121170 | 4/1999 |
| JP | 2000-003789 | 1/2000 |
| JP | 2000-208262 | 7/2000 |
| JP | 2000-215986 | 8/2000 |
| JP | 2000-243571 | 9/2000 |
| JP | 2001-023776 | 1/2001 |
| JP | 2001-52870 | 2/2001 |
| JP | 2002-043063 | 2/2002 |
| TW | 243 470 | 3/1995 |
| TW | 366598 | 8/1999 |
| TW | 451601 | 8/2001 |
| WO | WO 98/08360 | 2/1998 |
| WO | WO 98/24271 * | 6/1998 |
| WO | WO 99-12396 * | 3/1999 |
| WO | WO 99/12398 * | 3/1999 |
| WO | WO00-059267 | 10/2000 |
| WO | WO 02/47457 | 6/2002 |

OTHER PUBLICATIONS

Tang et al. "Organic electroluminescent diodes." Applied Physics Letters 51(12): 1987. p. 913-915.

Kijima et al. "A blue organic light emitting diode." JPN. J. Appl. Phys. 38/Part 1(9A): 1999. pp. 5274-5277.

C. Adachi et al. "Electroluminescence in organic films with three-layer structure." JPN. J. Appl. Phys. 27(2): 1988. p. L269-L271.

C.W. Tang et al. "Electroluminescence of doped organic thin films." J. Appl. Phys. 65(9): 1989. p. 3610-3616.

"New Aspect of Research and Development of Organic EL." M&BE Seminar, Bulletin of Organic Molecular/Bioelectronics Subcommittee, Society of Applied Physics, 11(1):2000. p. 3-12 (in English).

T. Wakimoto et al. "Organic EL Cells using alkaline metal compounds as electron injection materials." IEEE Transactions on Electron Devices 44(8): 1997. p. 1245-1248.

S.A. Van Slyke et al. "Organic electroluminescent devices with improved stablility." Appl. Phys. Lett. 69(15): 1996. p. 2160-2162.

D.F. O'Brien et al. "Improved energy transfer in electrophosphorescent devices." Appl. Phys. Lett. 74(3): 1999. p. 442-444.

T. Tsutsui et al. "High quantum efficiency in organic light-emitting devices with iridium-complex as a triplet emissive center." Jpn. J. Appl. Phys. 38/Part 2(12B): 1999. p. L1502-L1504.

T. Tsutsui et al. "Mechanism of Organic EL Element and Luminous Efficiency", Textbook of the $3^{rd}$ Seminar at Division of Organic Molecular Electronics and Bioelectronics, Society of Applied Physics, p. 31-37 (with English Translation).

J. Kido et al. "Multilayer white light-emitting organic electroluminescent device." Science 267: 1995. p. 1332-1334.

Takeshi Nishi et al., "High Efficiency TFT-OLED Display with Iridium-Complex As Triplet Emissive Center", Proceedings of the 10th International Workshop on Inorganic and Organic Electroluminescence, pp. 353-356, Dec. 4-7, 2000.

Sinapore Patent Application No. 200200037-0 Search and Examination Report dated Nov. 18, 2003 (8 pages).

* cited by examiner

Fig. 2A prior
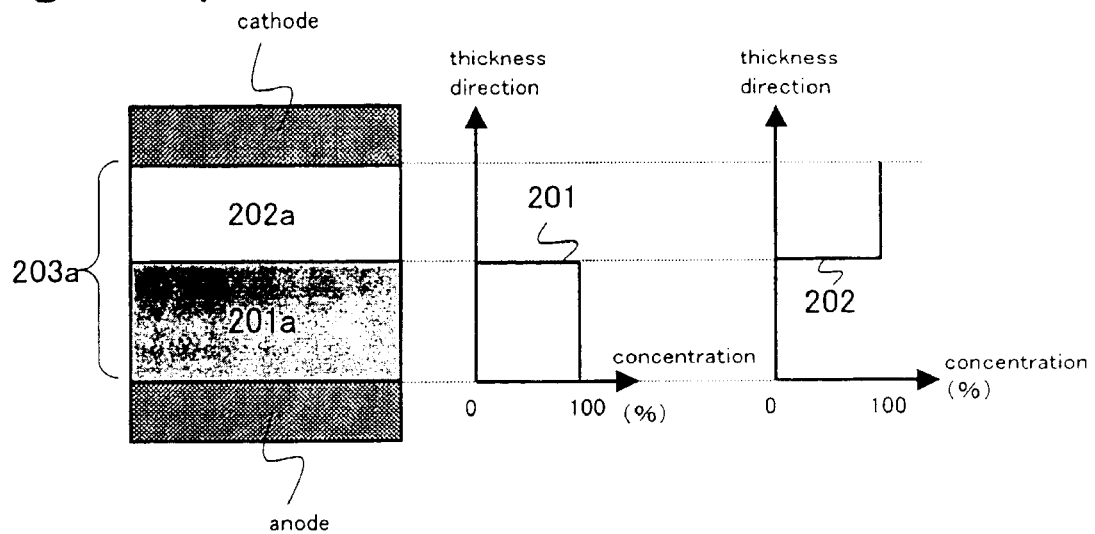
Fig. 2B
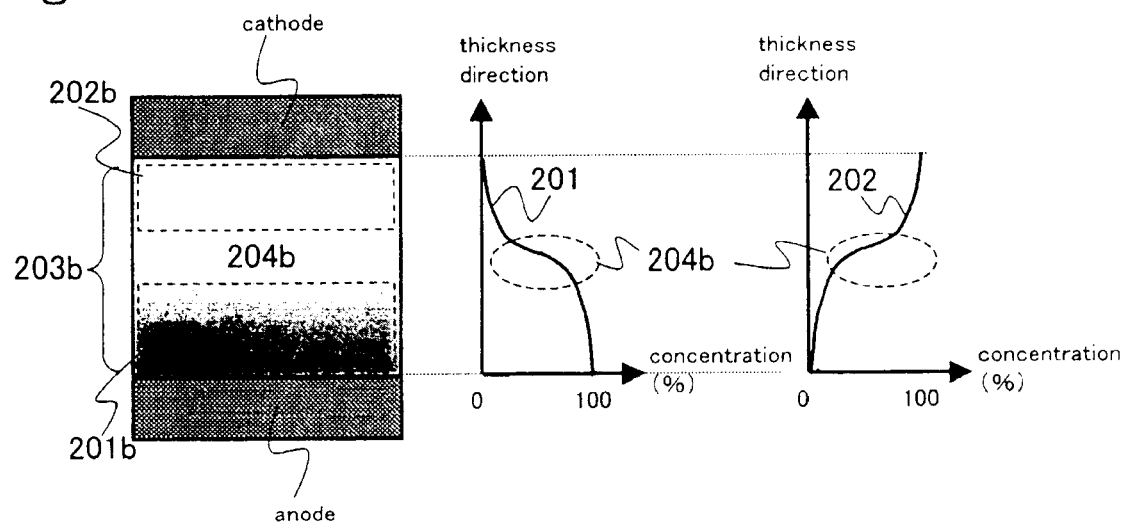

↓ 511

↓ 512

1 frame

SF1-SF6: subframe, $T_A$: write in time

LUMINESCENT DEVICE AND METHOD OF MANUFACTURING SAME

CROSS-REFERENCE TO RELATED APPLICATIONS

This application is a divisional application of U.S. application Ser. No. 10/043,786, filed Jan. 10, 2002, now abandoned, and claims the benefit of a foreign priority application filed in Japan as Serial No. 2001-009544 on Jan. 17, 2001. This application claims priority to each of these prior applications, and the disclosures of the prior applications are considered part of (and are incorporated by reference in) the disclosure of this application.

BACKGROUND OF THE INVENTION

1. Field of the Invention

The invention relates to a luminescent device using an organic luminescent element having an anode, a cathode, and a film (referred below to as "organic compound layer"), which includes an organic compound adapted to effect luminescence upon application of an electric field. More particularly, the invention relates to a luminescent device using an organic luminescent device whose organic compound film contains a high-molecular compound and which requires a lower drive voltage and has a longer life than luminescent devices of the related art, and a method of manufacturing this luminescent devices. Note that the luminescent device described in the specification of the present application indicates an image display device or a luminescent device, which use an organic luminescent element as luminescent element. Also, the luminescent device includes all of modules, in which a connector, for example, an anisotropic electroconductive film (FPC: Flexible printed circuit) or a TAB (Tape Automated Bonding) tape or a TCP (Tape Carrier Package) is mounted to an organic luminescent element, modules, in which a printed-circuit board is provided on a TAB tape or a tip end of a TCP, or modules, in which an IC (integrated circuit) is directly mounted on an organic luminescent element in the COG (Chip On Glass) system.

2. Description of the Related Art

An organic luminescent element is one adapted to effect luminescence upon application of an electric field. A mechanism for luminescence has been said to reside in that an organic compound layer is interposed between electrodes, upon application of voltage thereto electrons filled from a cathode and holes filled from an anode recombine together at a center of luminescence in the organic compound layer to form excited molecules (referred below to as "molecule exciton"), and the molecule excitons discharge energy to produce luminescence when returned to the base state.

In addition, kinds of molecule excitons formed by the organic compound can include a singlet excited state and a triplet excited state, while the specification of the present invention contains the case where either of the excited states contributes to luminescence.

In such organic luminescent element, an organic compound layer is normally formed in a thin film below 1 μm. Also, since the organic luminescent element is a self-luminescent type one, in which the organic compound layer itself emits light, a backlight used in a conventional liquid crystal display is not necessary. Accordingly, the organic luminescent element can be very advantageously formed to be thin and lightweight.

Also, with, for example, an organic compound layer of about 100 to 200 nm in thickness, a time period having elapsed from filling of a carrier to recombination thereof is in the order of several tens of nanosecond taking account of the extent of movement of the carrier in the organic compound layer, and luminescence is achieved in the order of less than one micro second even when the procedure from the recombination of the carrier to luminescence is included. Accordingly, one of the features is that the speed of response is very large.

Further, since the organic luminescent element is a carrier-filling type luminescent element, it can be driven by DC voltage, and is hard to generate noise. With respect to drive voltage, an adequate luminance of 100 cd/m$^2$ is achieved at 5.5 V by first making the thickness of an organic compound layer a uniform, super-thin film of around 100 nm, selecting an electrode material, which reduces a carrier filling barrier relative to the organic compound layer, and further introducing a single hetero structure (double structure) (Literature 1: C. W. Tang and S. A. VanSlyke, "Organic electroluminescent diodes", Applied Physics Letters, vol. 51, No. 12, 913-915 (1987)).

Owing to such performances as thin and lightweight, high-speed responsibility, DC low voltage drive, and the like, organic luminescent elements have been given attention as next-generation flat panel display elements. Also, since organic luminescent elements are of self-luminescent type and large in angle of visibility, they are comparatively favorable in visibility and believed to be effective as elements used for displays in portable equipments.

Hereupon, in the constitution of an organic luminescent element described in Literature 1, a carrier filling barrier is made small by using as a cathode a relatively stable Mg:Ag alloy of low work function to enhance an electron injecting quality. This makes it possible to fill a large amount of carrier into the organic compound layer.

Further, the recombination efficiency of the carrier is improved by leaps and bounds by application of a single hetero structure, in which a hole transporting layer composed of a diamine compound and an electron transporting luminescent layer composed of tris (8-quinolinolato) aluminium (hereinafter written as "Alq$_3$") are laminated as an organic compound layer, which is explained below.

In the case of, for example, an organic luminescent element having only a single Alq$_3$ layer, a major part of electrons filled from a cathode reaches an anode without recombining with holes, making the luminescence efficiency very low, since Alq$_3$ is of electron transporting quality. That is, in order to have the single-layered organic luminescent element efficiently emitting light (or driving at low voltage), it is necessary to use a material (referred below to as "bipolar material") capable of carrying both electrons and holes in well-balanced manner, and Alq$_3$ does not meet such requirement.

However, application of the single hetero structure described in Literature 1 causes electrons filled from a cathode to be blocked by an interface between the hole transporting layer and the electron transporting luminescent layer to be enclosed in the electron transporting luminescent layer. Accordingly, the carrier is efficiently recombined in the electron transporting luminescent layer to provide for efficient luminescence.

When the concept of such carrier blocking function is developed, it becomes possible to control a carrier recombining region. As an example, there is a report, according to which success is achieved in enclosing holes in a hole transporting layer and making the hole transporting layer luminescent by inserting a layer (hole blocking layer), which is capable of blocking holes, between the hole transporting layer and an electron transporting layer (Literature 2:

Yasunori KIJIMA, Nobutoshi ASAI and Shin-ichiro TAMURA, "A Blue Organic Light Emitting Diode", Japanese Journal of Applied Physics, Vol. 38, 5274-5277 (1999)).

Also, it can be said that the organic luminescent element described in Literature 1 is based on, so to speak, that thought of functional separation, according to which carrying of holes is performed by the hole transporting layer and carrying and luminescence of electrons are performed by the electron transporting luminescent layer. Such concept of functional separation has further grown to a concept of double heterostructure (three-layered structure), according to which a luminescent layer is inserted between the hole transporting layer and the electron transporting layer (Literature 3: Chihaya ADACHI, Shizuo TOKITO, Tetsuo TSUTSUI and Shogo SAITO, "Electroluminescence in Organic Films with Three-Layered Structure", Japanese Journal of Applied Physics, Vol. 27, No. 2, L269-L271 (1988)).

Such functional separation has an advantage in that the functional separation makes it unnecessary for a kind of organic material to have a variety of functions (luminescence, carrier carrying quality, filling quality of carrier from electrode, and so on) at a time, which provides a wide freedom in molecular design or the like (for example, it is unnecessary to unreasonably search for bipolar materials). That is, a high luminous efficiency can be easily attained by combining materials having a good luminous quality and a carrier carrying quality, respectively.

Owing to these advantages, the concept of the laminated structure (carrier blocking function or functional separation) itself described in Literature 1 has been widely utilized till now.

However, being a junction between substances of different kinds (in particular, a junction between insulating materials), the laminated structure described above will necessarily produce an energy barrier at an interface the substances. Since the presence of an energy barrier inhibits movements of a carrier at the interface, the two following problems are caused.

One of the problems is that it results in a barrier leading to further reduction of drive voltage. Actually, it has been reported with respect to existing organic luminescent elements that an element of a single-layered structure making use of a conjugate polymer is excellent in terms of drive voltage and holds top data (comparison in luminescence from the singlet excited state) in power efficiency (unit:"lm/W") (Literature 4: Tetsuo Tsutsui "bulletin of organic molecular/bioelectronics" subcommittee of Society of Applied Physics, Vol. 11, No. 1, P. 8 (2000)).

In addition, the conjugate polymer described in Literature 4 is a bipolar material, and can attain a level equivalent to that of the laminated structure with respect to the recombination efficiency of a carrier. Accordingly, it demonstrates that a single layer structure having less interfaces is actually low in drive voltage provided that a method making use of a bipolar material can make an equivalent recombination efficiency of a carrier without the use of any laminated structure.

For example, there is a method, in which a material for mitigating an energy barrier is inserted at an interface between an electrode and an organic compound layer to enhance a carrier filling quality to reduce drive voltage (Literature 5: Takeo Wakimoto, Yoshinori Fukuda, Kenichi Nagayama, Akira Yokoi, Hitoshi Nakada, and Masami Tsuchida, "Organic EL Cells Using Alkaline Metal Compounds as Electron Injection Materials", IEE TRANSACTIONS ON ELECTRON DEVICES, VOL. 44, NO. 8, 1245-1248 (1977)). In Literature 5, the use of $Li_2O$ as an electron injecting layer has been successful in reduction of drive voltage.

However, the carrier transfer between organic materials (e.g., between the hole transport layer and luminescent layer; the interface will hereinafter be called "organic interface") remains as an unsettled issue and is considered to be an important point in catching up with the low drive voltage provided by the single-layered structure.

Further, the other problem caused by an energy barrier is believed to be an influence on the service life of organic luminescent elements. That is, movements of a carrier are impeded, and brilliance is lowered due to build-up of charges.

While any definite theory has not been established with respect to such mechanism of deterioration, there is a report that lowering of brilliance can be suppressed by inserting a hole injecting layer between an anode and a hole transporting layer and employing not DC driving but AC driving of rectangular wave (Literature 6: S. A. VanSlyke, C. H. Chen, and C. W. Tang, "Organic electroluminescent devices with improved stability", Applied Physics Letters, Vol. 69, No. 15, 2160-2162 (1996)). This can be said to present an experimental evidence that lowering of brilliance can be suppressed by eliminating accumulation of charges due to insertion of a hole injecting layer and AC driving.

It can be said from the above that on one hand the laminated structure has an advantage in enabling easily enhancing the recombination efficiency of a carrier and enlarging a range of material selection in terms of functional separation and on the other hand formation of many organic interfaces impedes movements of a carrier and has an influence on lowering of drive voltage and brilliance.

BRIEF SUMMARY OF THE INVENTION

SUMMARY OF THE INVENTION

Accordingly, the invention has its object to relax an energy barrier present in an organic compound layer and enhance mobility of carriers by manufacturing an element of different concept from that of the conventionally used laminated structure, and at the same time to express functions (referred below to as "functional expression") of a plurality of various materials in the same manner as in functional separation involved in the laminated structure. Thereby, the invention has its object to provide an organic luminescent element, which is lower in drive voltage and longer in service life than those in the related art.

Also, the invention has its object to remove organic interfaces present in an organic compound layer and enhance mobility of carriers by manufacturing an element of different concept from that of the conventionally used laminated structure, in which carriers in a luminescent layer are blocked for recombination, and at the same time to express functions (referred below to as "function expression") of a plurality of various materials in the same manner as in functional separation involved in the laminated structure. Thereby, the invention has its object to provide an organic luminescent element, which is lower in drive voltage and longer in service life than those in the related art.

Mitigation of an energy barrier in a laminated structure is noticeably found in the technique of insertion of a carrier filling layer as described in Literature 5. A hole injecting layer is exemplarily illustrated with the use of an energy band diagram in FIG. 1B.

In FIG. 1A, an anode 101 and a hole injecting layer 102 are joined directly to each other, in which case an energy barrier 104 associated with the anode 101 and the hole injecting layer 102 is large. However, the energy barrier can be designed in a stepwise manner (FIG. 1B) by inserting as a hole injecting layer 103 a material having a level of highest occupied molecular orbit (referred below to as "HOMO") positioned intermediate between ionization potential of the anode and a HOMO level of the hole transporting layer.

Designing the stepwise energy barrier as shown in FIG. 1B makes it possible to enhance the filling quality of a carrier from an electrode, and to surely lower the drive voltage to some extent. However, there is caused a problem that an increase in the number of layers results in an increase in the number of organic interfaces. This is thought as indicated in Literature 4 to be responsible for the fact that the single-layered structure holds top data in drive voltage and power efficiency.

Conversely, by overcoming such problem, it is possible to come level with drive voltage and power efficiency in the single-layered structure while making the best use of an advantage (a variety of materials can be combined, and any complex molecular design is unnecessary) in a laminated structure.

The present inventor came up a method of substantially eliminating an interface in an organic compound layer containing two or more kinds of organic compounds (at least one of which is a high-molecular compound), thereby relaxing an energy barrier in the organic compound layer.

In case where the organic compound layer contains at least two compounds selected from a group of a hole injection compound which receives holes from the anode, an electron injection compound which receives electrons from the cathode, a hole transport compound, an electron transport compound, a blocking compound capable of inhibiting transfer of electron or hole, and a luminescent compound which demonstrates light emission, the scheme substantially eliminates an interface in the organic compound layer by providing an area (hereinafter called "mixed region") where the at least two compounds are mixed at a position located apart from the electrodes. This scheme will hereinafter be called "mixed junction".

The reason for the use of a high-molecular compound in the present invention is that a high-molecular compound generally has a large carrier mobility and can be driven with a low voltage. That is, the feature of the present invention lies in that mixed junction is carried out in a system which uses a high-molecular compound.

In case where such mixed junction is formed, the mixed region may be doped with a guest. Since carrier is considered to transfer smoothly in the mixed region, it is preferable to use a luminescent compound which demonstrates light emission as a guest.

As the mixed junction described above is formed, it is possible to prepare an organic luminescent element which does not show an obvious laminated structure (i.e., which does not have an obvious organic interface) and which ensure a functional realization.

When a mixed region in which a first organic compound and a second organic compound different from the first organic compound are mixed is provided in an organic compound layer containing the first organic compound and the second organic compound, there are a case where the first and second organic compounds are both high-molecular compounds and a case where one of the two organic compounds is a low-molecular compound. It is more preferable to use a scheme of continuously changing the concentrations of the first and second organic compounds in the mixed region. Those schemes will hereinafter be called "continuous junction". A mixed region in this case is particularly called "continuous junction area".

FIGS. 2A and 2B show conceptual diagrams of the laminated structure of the related art and the continuous junction of the invention. FIG. 2A shows the laminated structure of the related art (single heterostructure). Specifically, the single heterostructure has an organic compound film 203a comprising a first organic compound 201 and a second organic compound 202 and a laminated structure (which may be said to be an obvious organic interface) formed by a first organic compound layer 201a and a second organic compound layer 202a. In this case, there is no area where the concentration of the first organic compound 201 and the concentration of the second organic compound 202 gradually change, but the concentrations are discontinuous (i.e., each of the concentrations changes from 0% to 100% or from 100% to 0% in the organic interface).

In the case of the continuous junction of the invention (FIG. 2B), however, there is an area where the concentrations of the first organic compound 201 and the second organic compound 202 gradually change (i.e., a continuous junction area 204b), so that there is no obvious organic interface. Because there are an area where the first organic compound can express its function (first function area 201b) and an area where the second organic compound can express its function (second function area 202b), the functions of the individual materials can be expressed.

As the continuous junction disc rived above is formed, it is possible to prepare an organic luminescent element which does not show an obvious laminated structure (i.e., which does not have an obvious organic interface) and which ensure a functional realization.

From the viewpoint of the concept of the invention (which express the functions of plural and various kinds of materials without using a laminated structure), it is preferable that the first organic compound and the second organic compound should have different functions.

In case where the first organic compound and the second organic compound are both high-molecular compounds, the structure is considered that one of the high-molecular compounds expresses light emission and the other expresses a carrier transport function. In case where the second organic compound is a low-molecular compound, there may be a structure where the low-molecular compound expresses light emission and the high-molecular compound expresses a carrier transport function and a structure where the high-molecular compound expresses light emission and the low-molecular compound expresses a carrier transport function.

In the case where the high-molecular compound expresses a carrier transport function, it is preferable that the high-molecular compound should include π electrons (i.e., a conductive high-molecular compound) and should be chemically doped to improve the conductivity.

One of a polythiophene derivative, a polyaniline derivative, and a polyvinylcarbazole derivative is a preferable high-molecular compound for a hole transport material or a luminescent material. Alternatively, one of a polyparaphenylenevinylene derivative, a polydialkylfluorene derivative, and a polyphenylene derivative is a preferable material for the luminescent material.

In case where the mixed junction described above (including the continuous junction) is formed, there may be a scheme of adding a third organic compound as a guest into the mixed region to thereby provide the function of the guest. From the viewpoint of the functional realization, it is preferable to use a luminescent compound which demonstrates light emission as a guest. This is because the carrier recombination efficiency can be enhanced to improve the luminescent efficiency by providing the first organic compound and second organic compound which compose the mixed region with a carrier transport function or a blocking function and adding a luminescent compound into the mixed region.

FIG. 3A shows a conceptual diagram for this case. In FIG. 3A, an organic compound layer 303 which contains a first organic compound and a second organic compound is provided on a substrate 301 between an anode 302 and a cathode 304 and a mixed region 305 is added with a compound 306 which demonstrates light emission to be a luminescent region.

Hereupon, in view of the luminescent efficiency, organic luminescent elements capable of converting energy (referred below to as "triplet excited energy"), which is discharged when returned to a base state from a triplet excited state, into luminance, have been successively presented, and notice has been taken of their luminous efficiency (Literature 7: D. F. O'Brien, M. A. Baldo, M. E. Thompson and S. R. Forrest, "Improved energy transfer in electrophosphorescent devices", Applied Physics Letters, Vol. 74, No. 3, 442-444 (1999)), (Literature 8: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency in Organic Luminescent devices with Iridium-Complex as a Triplet Emissive Center", Japanese Journal of Applied Physics, Vol. 38, L1502-L1504 (1999)).

A metal complex, of which central metal is platinum, is used in Literature 7, and a metal complex, of which central metal is iridium, is used in Literature 8. These organic luminescent elements capable of converting triplet excited energy into luminance (referred below to as "triplet luminescent diode") can attain higher intensity luminance and higher luminous efficiency than in the related art.

However, Literature 8 has presented an example, in which half-life of luminance is about 170 hours in the case where the initial luminance is set to 500 $cd/m^2$, thus causing a problem in service life of an element. Hereupon, application of the invention to triplet light emitting diodes can provide a highly functional luminescent element, which is long in service life in addition to high intensity luminance and high luminous efficiency based on luminance from a triplet excited state.

Therefore, the invention covers a case where a material which can convert the triplet excited energy into luminescence is selected as the third organic compound or a guest and is added into the mixed region.

The third organic compound need not be limited to a luminescent compound which demonstrates light emission. In case where the first organic compound or the second organic compound emits light, particularly, it is preferable to use, as the third organic compound, a compound which has a larger energy difference between the highest occupied molecular orbital (HOMO) and the lowest unoccupied molecular orbital (LUMO) (i.e., a compound capable of blocking carriers and molecular excitons) as compared with the first organic compound and the second organic compound. This scheme can enhance the carrier recombination efficiency in the mixed region where the first organic compound and the second organic compound are mixed and improve the luminescent efficiency.

FIG. 3B shows a conceptual diagram for this case. In FIG. 3B, an organic compound layer 303 which contains a first organic compound and a second organic compound is provided on a substrate 301 between an anode 302 and a cathode 304 and a mixed region 305 is added with a compound 307 which can block carriers and molecular excitons.

In FIG. 3B, an luminescent region added with a luminescent compound 306 which emits light is provided in the mixed region 305. That is, FIG. 3B shows the structure that combined the scheme of using a luminescent compound which emits light as the third organic compound (FIG. 3A) with adding of the blocking compound. Because the compound 307 that can block carriers and molecular excitons is located closer to the cathode side than the luminescent compound 306 that emits light, a hole blocking compound is preferably used as the compound 307 that can block carriers and molecular excitons.

One of a phenanthroline derivative, an oxadiazole derivative and a triazole derivative is available for the compound that can block carriers and molecular excitons.

In case of specifying the mixed regions mentioned above, elemental analysis by SIMS (Secondary Ion Mass Spectrometry) is considered as an important technique. In case of the continuous junction, particularly, it should be apparent from the conceptual diagram of FIGS. 2A and 2B that we can expect an elemental analysis result having a more notable difference than the laminated structure element of the related art.

The present invention therefore covers a luminescent device that has an region where a detection amount of element which is detectable by SIMS among elements composing the first organic compound or the second organic compound changes continuously in a direction from the anode to the cathode.

A high-molecular compound which contains a element belonging to the group 15 or group 16 of the periodic table is well used in an ordinary organic luminescent element and a compound containing a element belonging to the group 17 of the periodic table may be chemically doped in order to improve the conductivity of the high-molecular compound. A change in concentration can therefore be observed more notably by forming a continuous junction region comprising a material which contains an element belonging to the groups 15 to 17 thereof and a material which does not. Nitrogen, phosphorus, oxygen, sulfur, fluorine, chlorine, bromine and iodine are typical as the elements belonging groups 15 to 17 thereof.

In case where the third organic compound is added as a guest into the mixed region, a metal complex may be used as a compound to be the guest, particularly, a luminescent compound which demonstrates light emission.

Therefore, the present invention covers a luminescent device wherein the third organic compound is a metal complex having a metal element, and a detection region of the metal element detectable by SIMS is a region including both the first organic compound and the second organic compound (i.e., mixed region). Aluminum, zinc and beryllium are typical as the metal element. In case where the third organic compound is a luminescent compound which emits light from the triplet excited state, a metal complex having iridium or platinum as a central metal is typical, so that iridium or platinum can be detected.

A luminescent device, which is lower in drive voltage and longer in service life than a prior one, can be provided by practicing the invention described above. Further, an electric appliance, which is lower in power consumption and more durable than in the prior art, can be provided when manufactured by the use of such luminescent device.

BRIEF DESCRIPTION OF THE DRAWINGS

FIGS. 2A and 2B are diagrams showing the structures of organic luminescent elements;

DETAILED DESCRIPTION OF THE INVENTION

Embodiments of the invention will be described below. In addition, at least one of an anode and a cathode in an organic luminescent element may be transparent sufficiently to take out luminescence, while the embodiment will be described with respect to an element structure, in which a transparent anode is formed on a substrate and luminescence is taken out from the anode. Actually, a structure, in which luminescence is taken out from a cathode and a structure, in which light is taken out from a side opposite to the substrate, are applicable.

What is important in working out the invention is a fabrication process of forming a mixed region or a continuous junction region. The present inventor has contrived a step of forming a mixed region or a continuous junction region in an organic compound film containing a high-molecular compound. The following will discuss a method of manufacturing an organic luminescent element according to the invention.

In the fabrication process of the related art (in case where a laminated structure is constructed by wet-supplying), a first solution in which, for example, a first organic compound is dissolved is supplied and a solvent contained in the first solution is completely removed by heating or the like, after which a second organic compound dissolved in a solution in which the first organic compound is not eluted is deposited. This fabrication process produces an obvious organic interface.

Figure 1A:
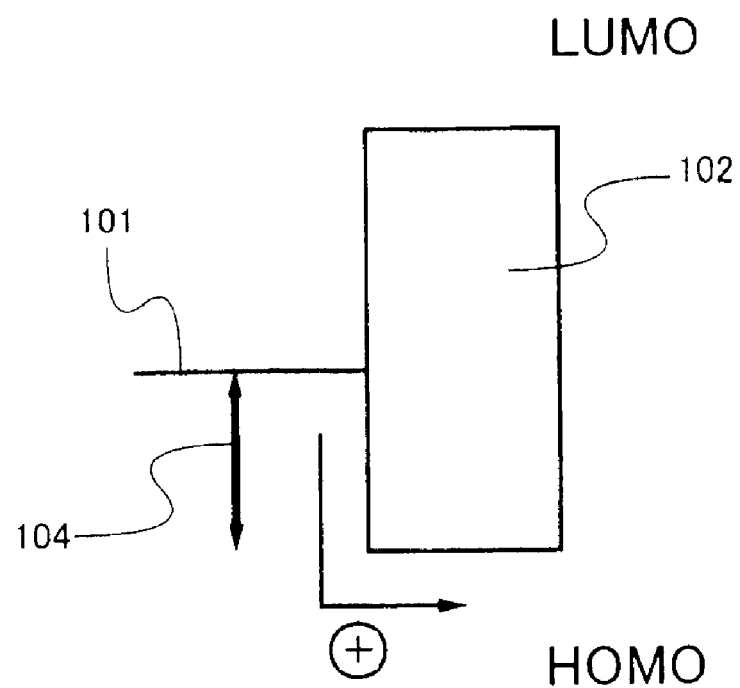
FIGS. 1A and 1B are diagrams illustrating the role of a hole injection layer.
Figure 1B:
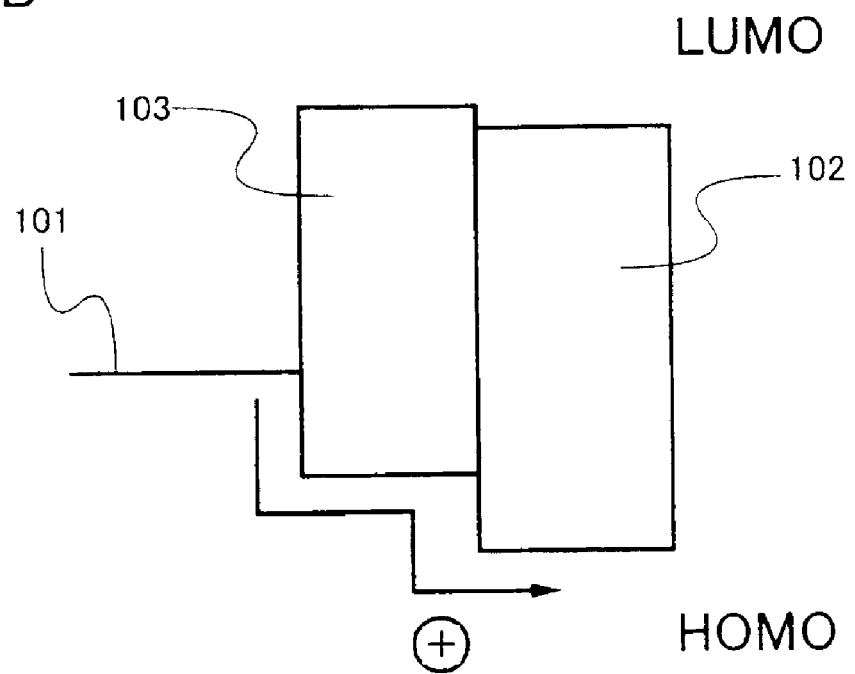
Figure 3A:
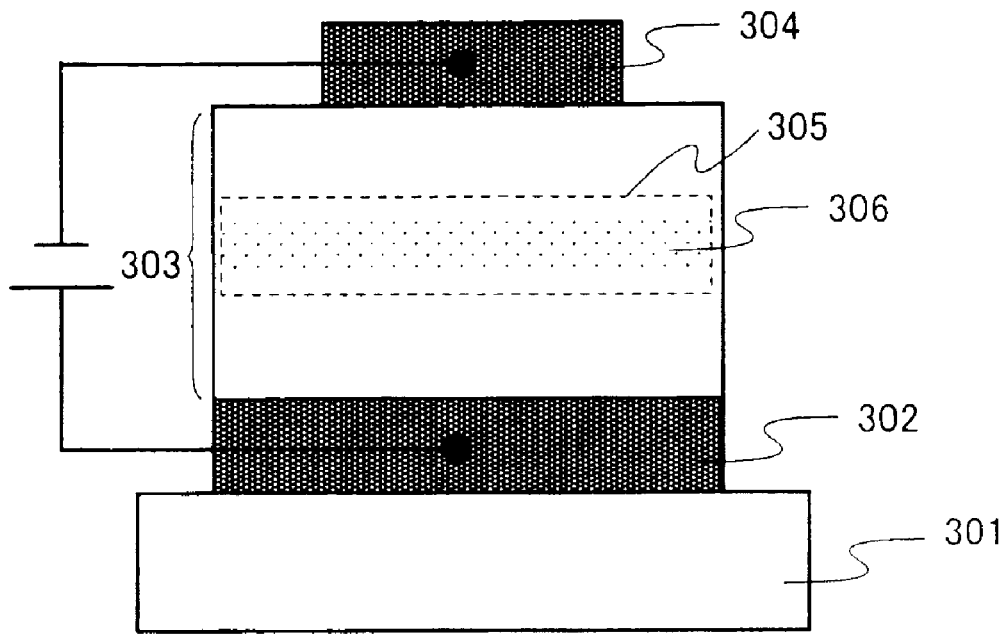
FIGS. 3A and 3B are diagrams showing the structures of organic luminescent elements.
Figure 3B:
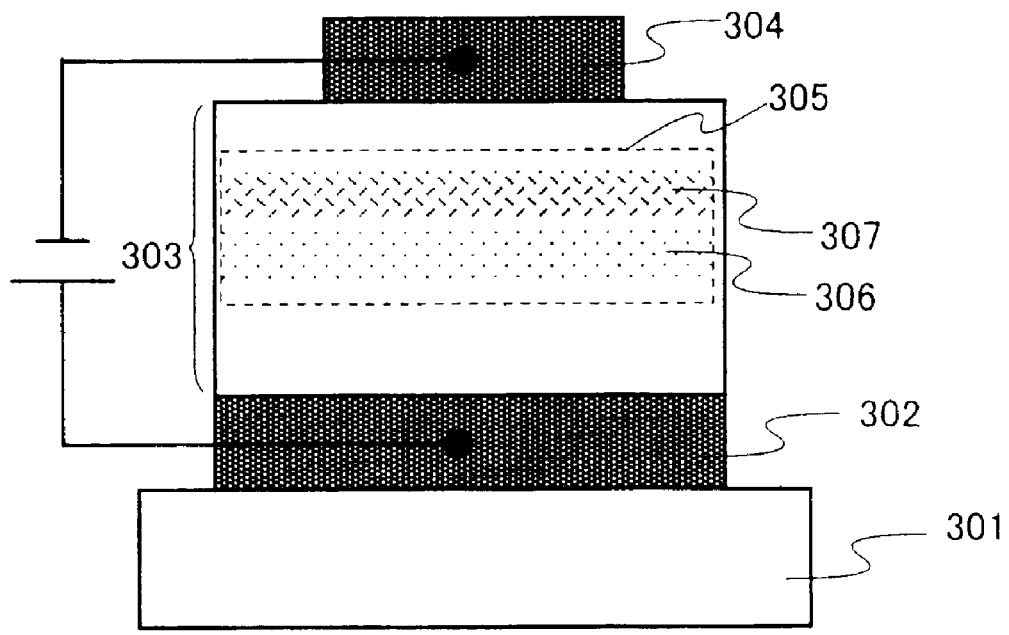
Figure 4:
FIG. 4 is a diagram showing the cross-sectional TEM of an organic compound layer.

FIG. 4 shows the cross-sectional TEM picture of an organic compound layer which is supplied by, for example, depositing a solution of polyethylene dioxythiophene (hereinafter called "PEDOT") doped with polystyrene sulfonate (hereinafter called "PSS") by spin coating, heating the resultant structure at 100° C. or high under an atmospheric pressure to completely remove moisture, then depositing a toluene solution of polyparaphenylenevinylene (hereinafter called "PPV") having an alkoxyl group by spin coating and heating and drying the resultant structure again. As apparent from FIG. 4, the fabrication process of the related art provides a laminated structure which has an obvious organic interface.

The present inventor has contrived five manufacturing methods as processes which overcome the above problem and form a mixed region or a concentration varying region. The following will discuss the simplest embodiments of the methods in case of an organic compound layer containing two types of organic compounds.

Figure 5A:
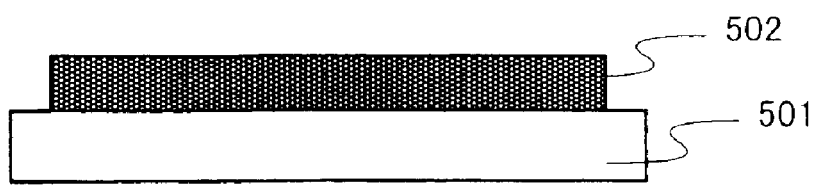
FIGS. 5A through 5E are diagrams illustrating a method of forming an organic compound layer.
Figure 5B:
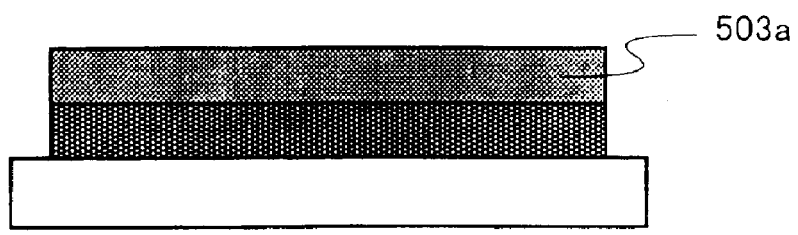
Figure 5C:
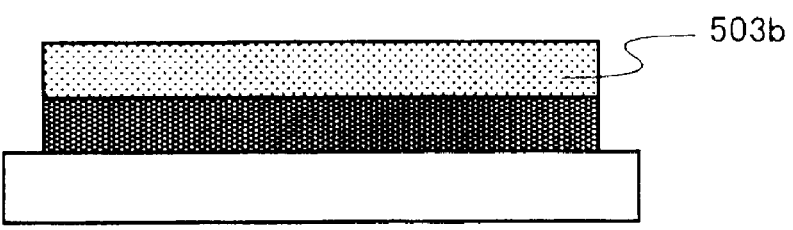
Figure 5D:
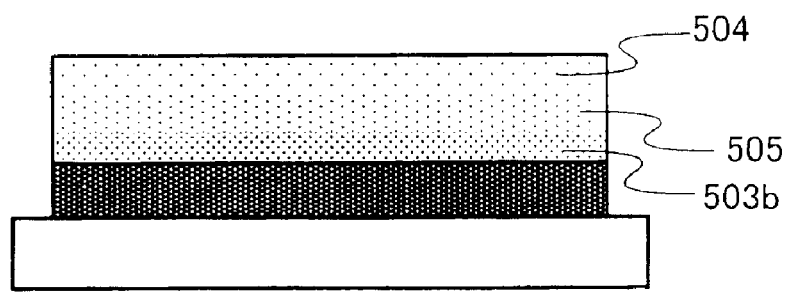
Figure 5E:
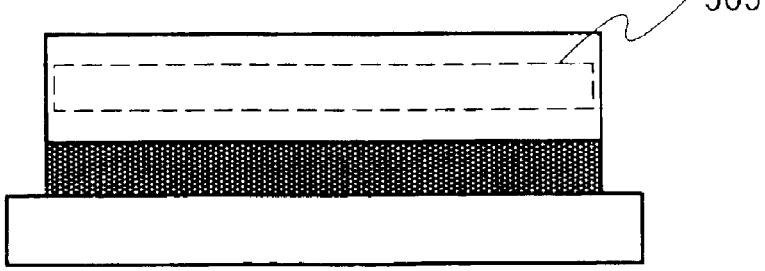

The first manufacturing method is illustrated in FIGS. 5A to 5E. First, a first solution 503a in which a first organic compound (high-molecular compound) is dissolved is wet-supplied on a substrate 501 (FIG. 5A) formed an electrode 502 (FIG. 5B). Next, as a step 511 of forming a mixed region or continuous junction region, the first solution 503a is heated at a temperature at which the vapor pressure of a solvent contained in the first solution 503a is lower than a pressure in a heating treatment atmosphere (FIG. 5C), then a second solution 504 in which a second organic compound is dissolved is wet-supplied in a state where a solvent 503b contained in the first solution 503a remains (FIG. 5D). Finally, the solvents are all removed by heating 512, thus yielding an organic compound layer according to the invention which has a mixed region or continuous junction area 505.

Figure 6A:
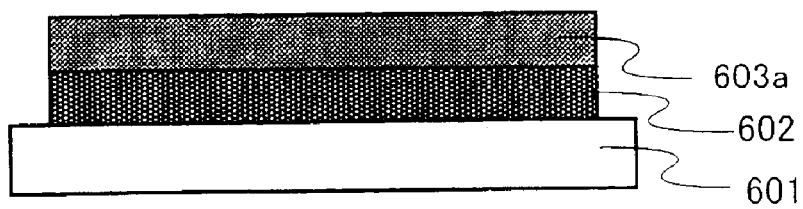
FIGS. 6A through 6E are diagrams illustrating a method of forming an organic compound layer.
Figure 6B:
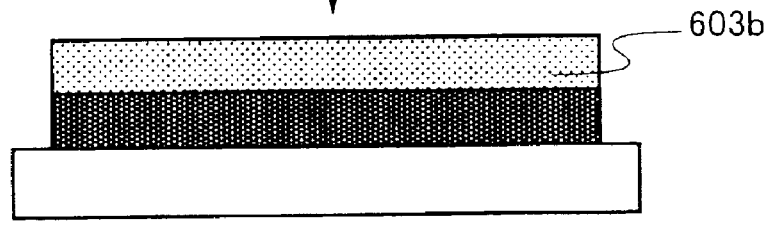
Figure 6C:
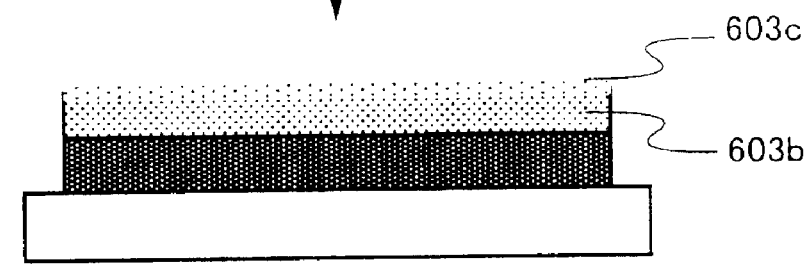
Figure 6D:
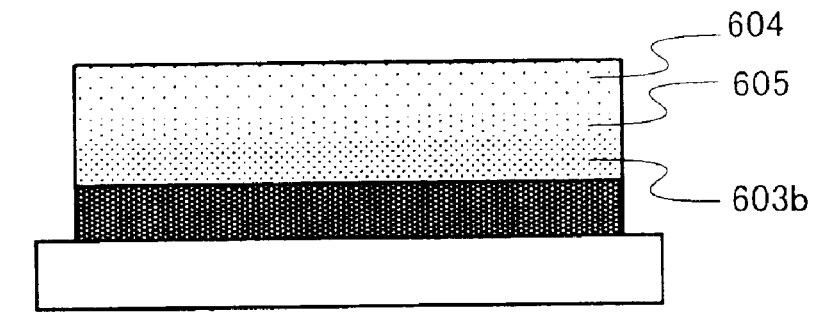
Figure 6E:
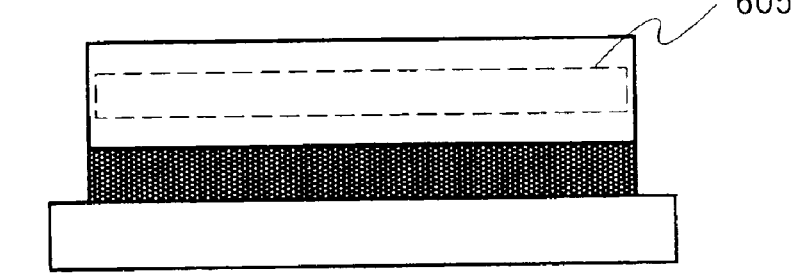

The second manufacturing method is illustrated in FIGS. 6A to 6E. First, a first solution 603a in which a first organic compound (high-molecular compound) is dissolved is wet-supplied on a substrate 601 formed an electrode 602 (FIG. 6A). Next, a first organic compound layer 603b is formed by completely removing a solvent contained in the first solution 603a by heating 611 (FIG. 6B). Further, as a step 612 of forming a mixed region or continuous junction region, an eluted area 603c is formed by placing the resultant structure in a state where the solvent contained in the first solution 603a is contained in a treating atmosphere of the step 612 (FIG. 6C), then a second solution 604 in which a second organic compound is dissolved is wet-supplied (FIG. 6D). Finally, all the solvents are removed by heating 613, thus yielding an organic compound layer according to the invention which has a mixed region or continuous junction region 605.

According to the third manufacturing method, a mixed region or continuous junction region can be formed by using a low-molecular compound which can be supplied by dry deposition as a first organic compound. That is, after a first organic compound layer 603b is deposited by vacuum evaporation or the like (the state in FIG. 6B), a second organic compound (high-molecular compound) dissolved in a solvent which can slightly dissolve the first organic compound is wet-supplied, thus yielding the state in FIG. 6D.

According to the fourth manufacturing method, a low-molecular compound can be used as a first organic compound in FIGS. 6A through 6E. Specifically, first, a first organic compound layer 603b is deposited by vacuum evaporation or the like to yield the state in FIG. 6B, then an eluted region 603c is formed by placing the resultant structure in a state where a solvent in which is capable of dissolving the first organic compound is contained in a treating atmosphere (FIG. 6C).

The second organic compound is made of a high-molecular material to be wet-supplied in every one of the first to fourth manufacturing methods. The present inventor has contrived the fifth manufacturing method as the reverse method of the first to fourth manufacturing methods. The fifth manufacturing method is one that a high-molecular material as the first organic compound, not the second organic compound, is wet-supplied first and then a low-molecular compound as the second organic compound is supplied by vacuum evaporation, thereby forming a mixed region or a continuous junction region.

According to the fifth method, after a solution in which the first organic compound (high-molecular material) is dissolved is wet-supplied, the resultant structure is fed into a vacuum chamber, then the second organic compound (low-molecular weight compound) is deposited by vacuum evaporation, and then the second organic compound (low-molecular weight compound) is diffused by heating, thereby forming a mixed region or a concentration varying region. The heating temperature can be any temperature at which the solvent in which the first organic compound is dissolved can completely be removed.

According to the fifth method, it is more preferable that heating be carried out under a reduced pressure of $10^{-4}$ Pa or lower. In this case, the preferable heating temperature is in a range of about 60° C. to 100°C.

Various schemes are feasible for the wet-supplying described above. The schemes available include wet deposition, such as spin coating or dip coating, which is used generally, in addition, adsorption and an ink jet system. Particularly, as the ink jet system can pattern an organic compound with a high precision and in a wide range, the system is considered as effective in manufacturing a high-definition and large-area luminescent device.

Figure 7A:
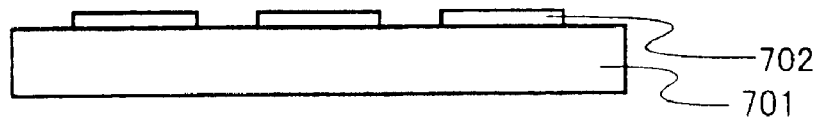
FIGS. 7A through 7E are diagrams illustrating a method of forming an organic compound layer.
Figure 7B:
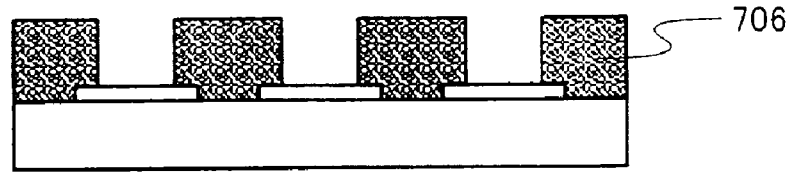
Figure 7C:
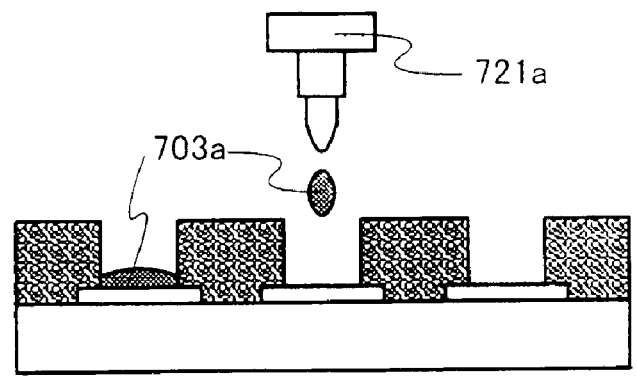
Figure 7D:
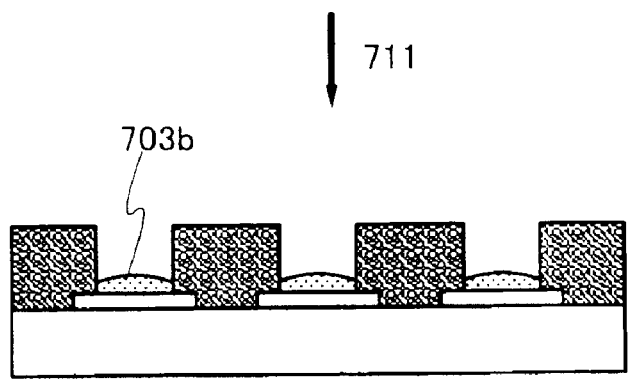
Figure 7E:
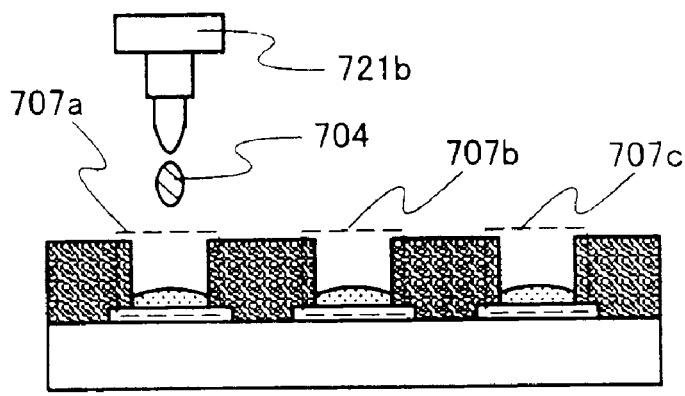

FIGS. 7A through 7E show a concept of realizing the first manufacturing method by the ink jet system. First, a bank structure 706 is formed on a substrate 701 having an electrode 702 (FIG. 7A) by photolithography (FIG. 7B). Next, a first solution 703a in which a first organic compound (high-molecular compound) is dissolved is wet-supplied by an ink jet printer head 721a (FIG. 7C). Then, a step 711 of forming a mixed region or a continuous junction region is carried out by heating the first solution 703a at a temperature lower than a temperature at which the vapor pressure of a solvent contained in the first solution 703a becomes an atmospheric pressure during a manufacturing (FIG. 7D) and wet-supplying a second solution 704 in which a second organic compound is dissolved by an ink jet printer head 721b in a state 703b where the solvent contained in the first solution 703a remains (FIG. 7E). Finally, all the solvents are removed by heating, thus yielding an organic compound layer according to the invention which has a mixed region or continuous junction region.

In case where a compound which demonstrates light emission is used as the second organic compound, for example, a full-color luminescent device can be prepared by supplying compounds which demonstrates light emission of red, green and blue separately on respective pixels 707a to 707c by using the ink jet printer head 721b.

The mixed region or continuous junction region disclosed in the present invention can be formed by any one of the manufacturing methods described above.

EMBODIMENT 1

An organic luminescent device which is manufactured by using the scheme illustrated in FIGS. 5A to 5E according to the invention will be specifically exemplified in this embodiment.

First, indium tin oxide (hereinafter called "ITO") is deposited by sputtering on a glass substrate to a thickness of about 100 nm and, thus, becomes an anode. Next, a solution of PEDOT doped with PSS as a hole transport natured material is deposited by spin coating on the anode.

As illustrated in FIGS. 5A to 5E, the substrate is heated at a temperature lower than the temperature (100° C.) at which the vapor pressure of water becomes an atmospheric pressure, so that the substrate is in the state that slight moisture remains in the PEDOT solution. Further, PPV (hereinafter called "MEH-PPV") substituted by alkoxyl group with toluene as a solvent is deposited by spin coating and heated to a temperature of 100° C. or higher to completely remove the solvent.

Finally, ytterbium is deposited as a cathode to a thickness of 400 nm by vacuum evaporation, thus providing an organic luminescent element according to the invention which emits green light originated from MEH-PPV.

EMBODIMENT 2

An organic luminescent element which is manufactured by using the scheme illustrated in FIGS. 6A to 6E according to the invention will be specifically exemplified in this embodiment.

First, ITO is deposited by sputtering on a glass substrate 601 to a thickness of about 100 nm, thus becomes an anode 602. Next, a PSS-doped PEDOT solution as a hole transport natured material is deposited by spin coating on the anode and heated at 150° C. for 10 minutes, thereby completely eliminating the solvent (moisture).

As illustrated in FIGS. 6A to 6E, polydioctylfluorene (hereinafter called "PDOF") with xylene as a solvent is spin-coated and is then heated to a temperature of 100° C. or higher to completely eliminate water and xylene.

Finally, calcium is deposited 400 nm thick and aluminum is then deposited 150 nm thick by vacuum evaporation, thus providing an organic luminescent element according to the invention which emits blue light originated from PDOF.

EMBODIMENT 3

An organic luminescent element which is manufactured by using the scheme of depositing a low-molecular compound by vacuum evaporation and supplying a high-molecular compound dissolved in a solvent in which the low-molecular compound is slightly dissolved will be specifically exemplified in this embodiment.

First, ITO is deposited by sputtering on a glass substrate to a thickness of about 100 nm, thus becomes an anode. Next, 4,4',4"-tris[N-(3-methylphenyl)-N-phenyl-amino]-triphenylamine (hereinafter called "MTDATA") as a hole transport natured material is deposited by vacuum evaporation on the anode.

Then, a solution obtained by dissolving a PPV precursor which is soluble in a polar solvent in ethanol is deposited by spin coating. Then, the resultant structure is heated to a temperature of 80° C. or higher to completely remove the solvent and polymerize PPV at the same time.

Finally, ytterbium is deposited as a cathode to a thickness of 400 nm by vacuum evaporation, thus providing an organic luminescent element according to the invention which emits green light originated from PPV.

EMBODIMENT 4

An organic luminescent element which is manufactured by using the scheme involving an ink jet system will be specifically exemplified in this embodiment.

First, ITO 702 is deposited by sputtering on a glass substrate 701 to a thickness of about 100 nm and a bunk structure 706 is formed by photolithography (FIG. 7B). Next, a PSS-doped PEDOT solution as a hole transport natured material is deposited on the anode 702 by an ink jet printer head 721a and heated at 150° C. for 10 minutes, thereby completely eliminating the solvent (moisture). PEDOT deposited this way becomes hard to be dissolved in water and is slightly eluted.

An ink using a solution 704 in which a water-soluble PPV precursor is dissolved is deposited by an ink jet printer head 721b and is then heated at 100° C. or higher, thereby completely eliminating water and xylene.

Finally, calcium is deposited 100 nm thick by vacuum evaporation and aluminum is then deposited 150 nm thick, thus providing an organic luminescent element according to the invention which emits green light originated from PPV.

EMBODIMENT 5

The following will specifically discuss an organic luminescent element doped with compound which emits light (a compound which emits light from the triplet excited state) in a mixed region or continuous junction region. The organic luminescent element is formed by the steps that a solution in which a first organic compound (high-molecular material) is dissolved is wet-supplied to a substrate having an electrode, the substrate is carried into a vacuum chamber, then a second organic compound (low-molecular weight compound) is deposited by vacuum evaporation, and then the second organic compound is diffused by heating, thereby the mixed region or the concentration gradation region is formed in the organic luminescent element. It is preferable that heating be carried out under a reduced pressure of $10^{-4}$ Pa or lower.

First, ITO is deposited by sputtering on a glass substrate to a thickness of about 100 nm, thus becomes an anode. Next, a chloroform solution containing polyvinylcarbazole (hereinafter called "PVK") is deposited by spin coating and heated to remove the solvent, in order to that PVK is used as a hole transport natured material. As a solution containing the same solvent (chloroform) is deposited thereafter, the deposition of the chloroform solution containing PVK should desirably be executed several times in order to increase the film thickness to a certain extent.

Next, a solution obtained by adding 5 wt % of a bis(2-phenylpyridine)-acetylacetonatoiridum (hereinafter called "Ir(ppy)$_2$(acac)") complex which is a triplet luminescent material into the chloroform solution containing PVK is deposited by spin coating on the PVK film deposited previously.

Then, tris (8-quinolinolato) aluminum (hereinafter written as "Alq$_3$") is deposited by vacuum evaporation at a reduced pressure of $10^{-3}$ Pa without heating the substrate. Thereafter, as the resultant structure is baked at 80° C. under a reduced pressure of $10^{-4}$ Pa, an region with PVK and Alq$_3$ as hosts and Ir(ppy)$_2$(acac) as a guest (region which an Ir(ppy)$_2$(acac) is doped in mixed region comprising PVK and Alq$_3$) can be formed.

Finally, an alloy of Al and Li is deposited as a cathode to a thickness of 150 nm by vacuum evaporation, thus providing an organic luminescent element according to the invention which emits green light originated from Ir(ppy)$_2$(acac).

EMBODIMENT 6

Figure 8:
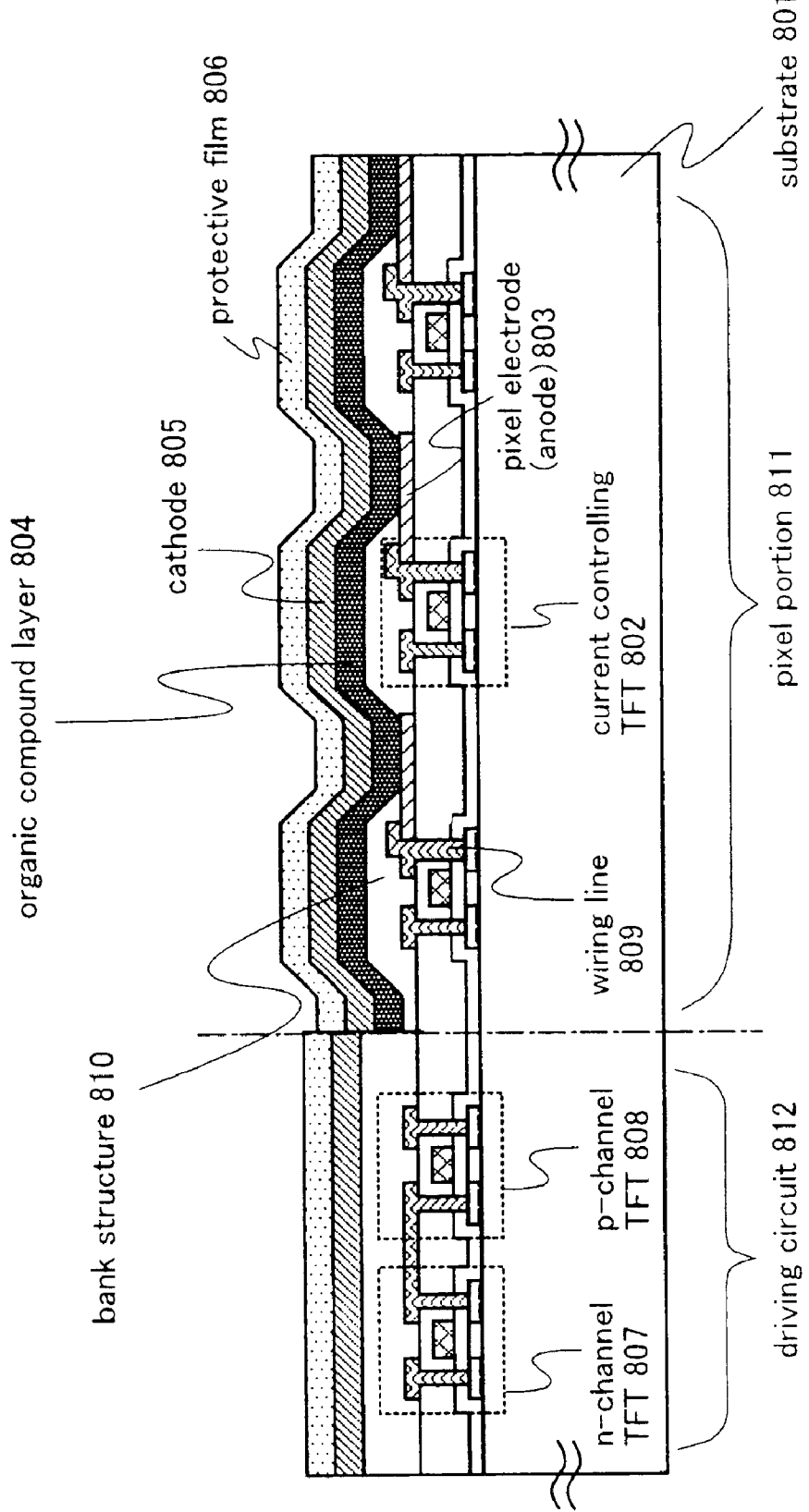
FIG. 8 is a diagram showing the cross-sectional structure of a luminescent device.

This embodiment describes a luminescent device that includes an organic luminescent element according to the present invention. FIG. 8 is sectional view of an active matrix luminescent device that uses an organic luminescent element of the present invention. A thin film transistor (hereinafter referred to as TFT) is used here as an active element, but the active element may be a MOS transistor.

The TFT shown as an example is a top gate TFT (planar TFT, to be specific), but a bottom gate TFT (typically a reverse stagger TFT) may be used instead.

In FIG. 8, 801 denotes a substrate. The substrate used here can transmit visible light. Specifically, a glass substrate, a quartz substrate, a crystal glass substrate, or a plastic substrate (including a plastic film) can be used. The substrate 801 refers to the substrate plus an insulating film formed on the surface of the substrate.

On the substrate 801, a pixel portion 811 and a driving circuit 812 are provided. The pixel portion 811 will be described first.

The pixel portion 811 is a region for displaying an image. A plurality of pixels are placed on the substrate, and each pixel is provided with a TFT 802 for controlling a current flowing in the organic luminescent element (hereinafter referred to as current controlling TFT) 802, a pixel electrode (anode) 803, an organic compound layer 804, and a cathode 805. Although only the current controlling TFT is shown in FIG. 8, each pixel has a TFT for controlling a voltage applied to a gate of the current controlling TFT (hereinafter referred to as switching TFT).

The current controlling TFT 802 here is preferably a p-channel TFT. Though an n-channel TFT may be used instead, a p-channel TFT as the current controlling TFT is more successful in reducing current consumption if the current controlling TFT is connected to the anode of the organic luminescent element as shown in FIG. 8. Note that, the switching TFT may be formed by either an n-channel TFT or a p-channel TFT.

A drain of the current controlling TFT 802 is electrically connected to the pixel electrode 803. In this embodiment, a conductive material having a work function of 4.5 to 5.5 eV is used as the material of the pixel electrode 803, and therefore the pixel electrode 803 functions as the anode of the organic luminescent element. A light-transmissive material, typically, indium oxide, tin oxide, zinc oxide, or a compound of these (ITO, for example), is used for the pixel electrode 803. On the pixel electrode 803, the organic compound layer 804 is formed.

On the organic compound layer 804, the cathode 805 is provided. The material of the cathode 805 is desirably a conductive material having a work function of 2.5 to 3.5 eV Typically, the cathode 805 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 803, the organic compound layer 804, and the cathode 805 is covered with a protective film 806. The protective film 806 is provided to protect the organic luminescent element from oxygen and moisture. Materials usable for the protective film 806 include silicon nitride, silicon oxynitride, aluminum oxide, tantalum oxide, and carbon (specifically, diamond-like carbon).

Next, the driving circuit 812 will be described. The driving circuit 812 is a region for controlling timing of signals (gate signals and data signals) to be sent to the pixel portion 811, and is provided with a shift register, a buffer, and a latch, as well as an analog switch (transfer gate) or level shifter. In FIG. 8, the basic unit of these circuits is a CMOS circuit composed of an n-channel TFT 807 and a p-channel TFT 808.

Known circuit structures can be applied to the shift register, the buffer, the latch, and the analog switch (transfer gate) or level shifter. Although the pixel portion 811 and the driving circuit 812 are provided on the same substrate in FIG. 8, IC or LSI may be electrically connected to the substrate instead of placing the driving circuit 812 on the substrate.

The pixel electrode (anode) 803 is electrically connected to the current controlling TFT 802 in FIG. 8 but the cathode may be connected to the current controlling TFT instead. In this case, the pixel electrode is formed from the material of the cathode 805 whereas the cathode is formed from the material of the pixel electrode (anode) 803. The current controlling TFT in this case is preferably an n-channel TFT.

The luminescent device shown in FIG. 8 is manufactured by a process in which formation of the pixel electrode 803 precedes formation of a wiring line 809. However, this process could roughen the surface of the pixel electrode 803. The roughened surface of the pixel electrode 803 may degrade characteristic of the organic luminescent element since it is a current-driven type element.

Figure 9:
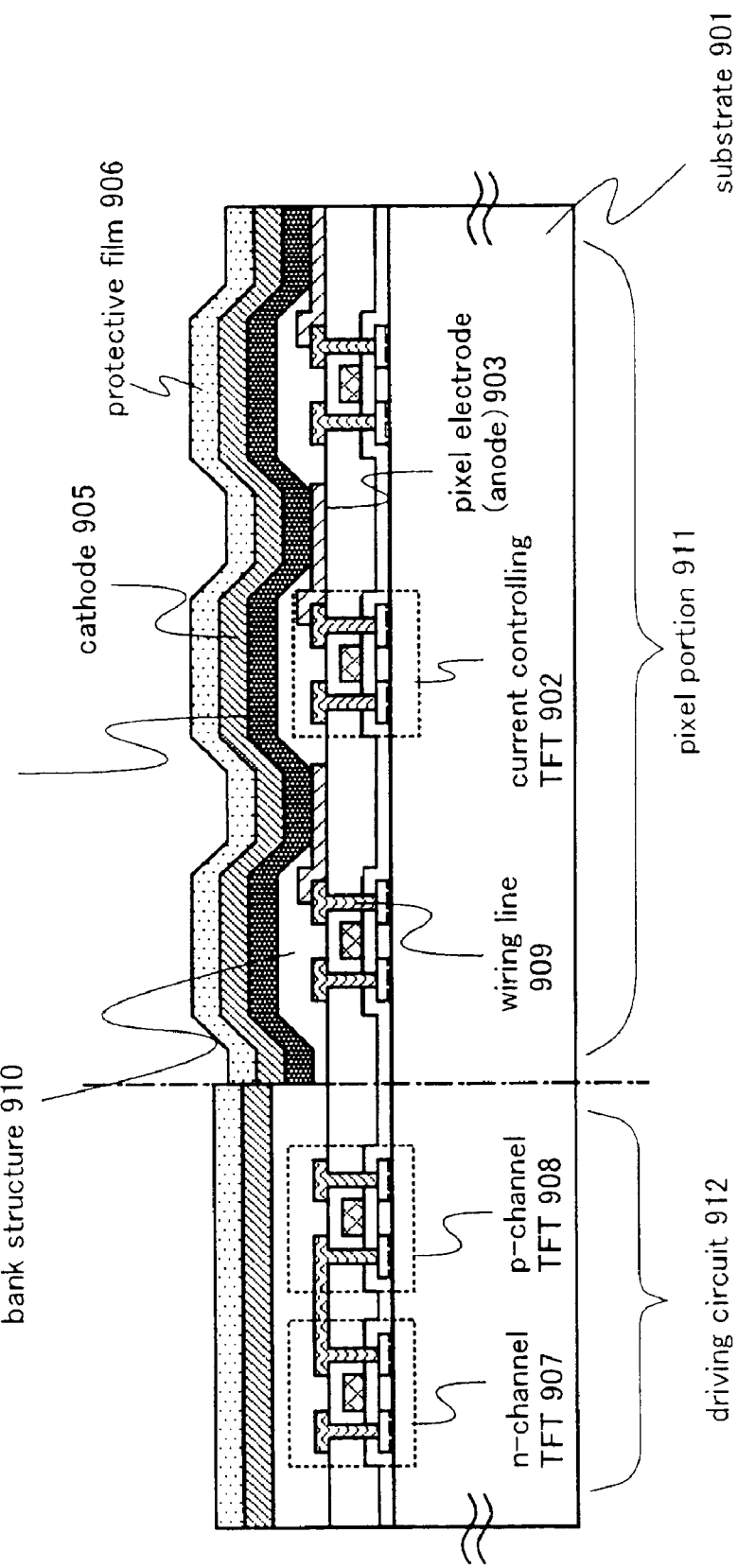
FIG. 9 is a diagram showing the cross-sectional structure of a luminescent device.

Then the pixel electrode 903 is formed after forming the wiring line 909 to obtain a luminescent device shown in FIG. 9. In this case, injection of current from the pixel electrode 803 can be improved compared to the structure of FIG. 8.

In FIGS. 8 and 9, a forward-tapered bank structures 810 or 910 separates the pixels placed in the pixel portions 811 or 911 from one another. If this bank structure is reverse-tapered, a contact between the bank structure and the pixel electrode can be avoided. An example thereof is shown in FIG. 10.

Figure 10:
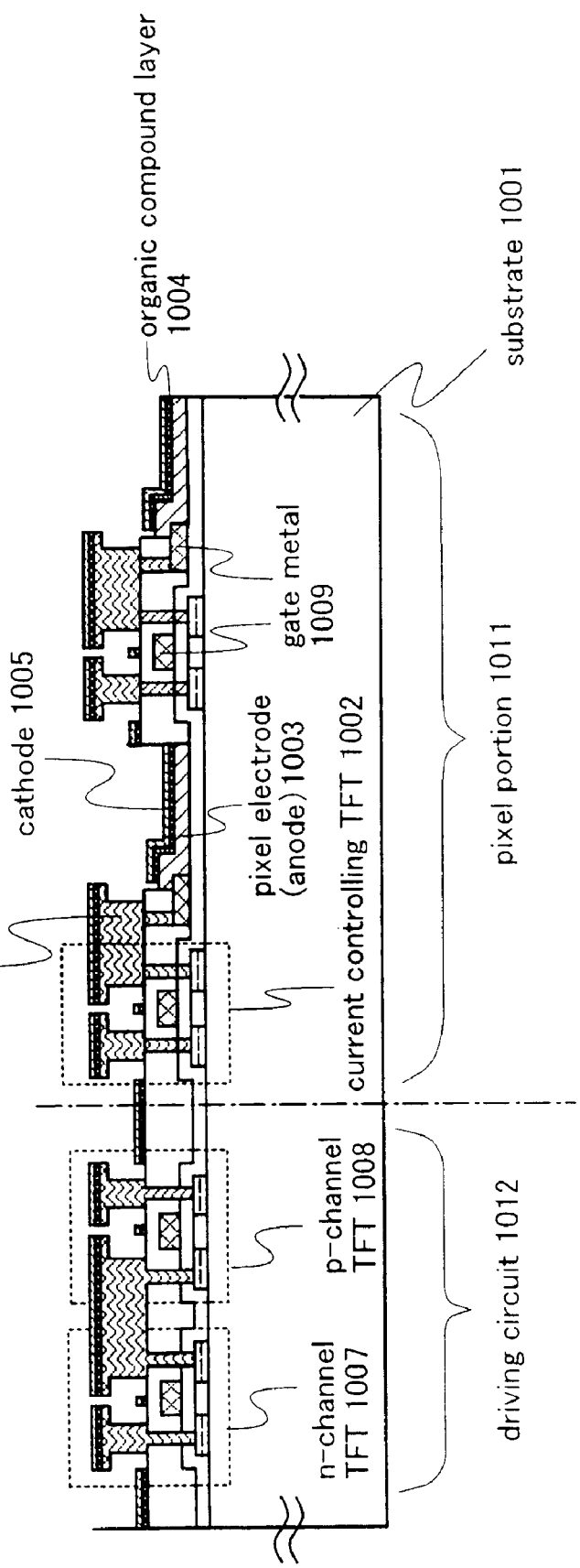
FIG. 10 is a diagram showing the cross-sectional structure of a luminescent device.

In FIG. 10, a wiring line also serves as a separation portion, forming a wiring line and separation portion 1010. The shape of the wiring line and separation portion 1010 shown in FIG. 10 (namely, a structure with eaves) is obtained by layering a metal that constitutes the wiring line and a material lower in etch rate than the metal (a metal nitride, for example) and then etching the laminate. This shape can prevent short circuit between a cathode 1005 and a pixel electrode 1003 or the wiring line. Unlike a usual active matrix luminescent device, the cathode 1005 on the pixel is striped in the device of FIG. 10 (similar to a cathode in a passive matrix device).

Figure 11A:
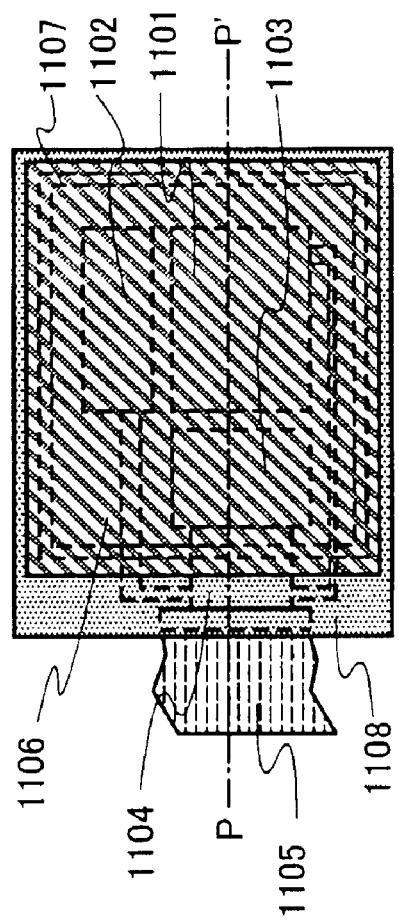
FIGS. 11A and 11B are diagrams respectively showing the top structure and the cross-sectional structure of a luminescent device.
Figure 11B:
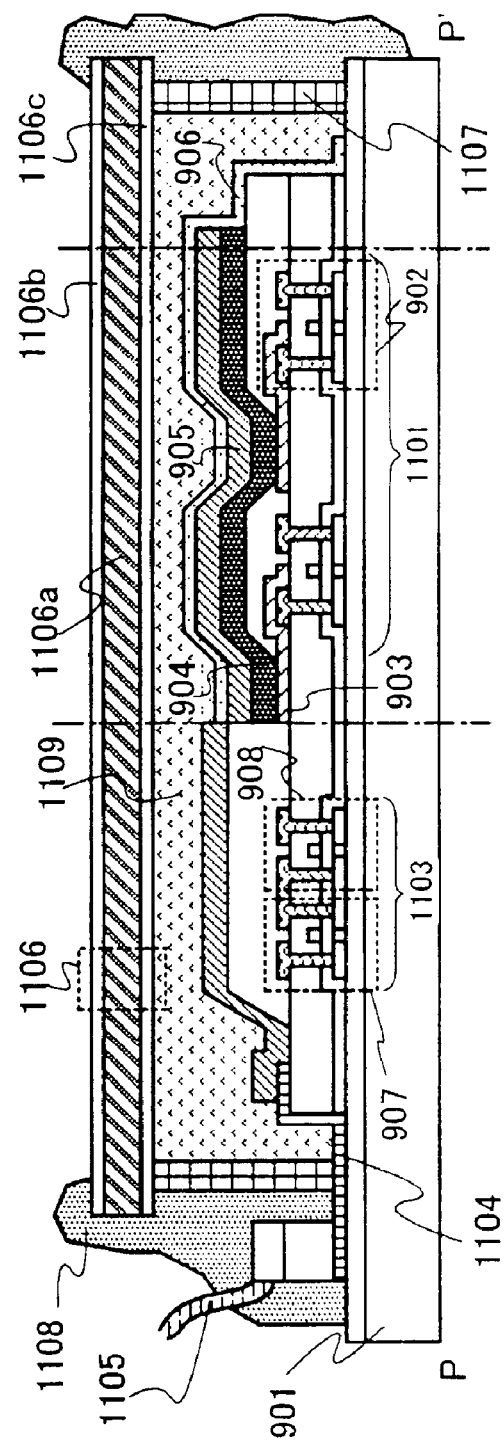

FIGS. 11A and 11B show the exterior of the active matrix luminescent device illustrated in FIG. 9. FIG. 11A is a top view thereof and FIG. 11B is a sectional view taken along the line P-P' of FIG. 11A. The symbols in FIG. 9 are used in FIG. 11.

In FIG. 11A, 1101 denotes a pixel portion, 1102 denotes a gate signal side driving circuit, and 1103 denotes a data signal side driving circuit. Signals to be sent to the gate signal side driving circuit 1102 and the data signal side driving circuit 1103 are inputted from a TAB (tape automated bonding) tape 1105 through an input wiring line 1104. Though not shown in the drawing, the TAB tape 1105 may be replaced by a TCP (tape carrier package) that is obtained by providing a TAB tape with an IC (integrated circuit).

Denoted by 1106 is the cover member that is provided in an upper part of the organic luminescent device shown in FIG. 9, and is bonded with a seal member 1107 formed of a resin. The cover member 1106 may be any material as long as it does not transmit oxygen and water. In this embodiment, as shown in FIG. 11B, the cover member 1106 is composed of a plastic member 1106a and carbon films (specifically, diamond-like carbon films) 1106b and 1106c that are formed on the front and back of the plastic member 1106a, respectively.

As shown in FIG. 11B, the seal member 1107 is covered with a sealing member 1108 made of a resin so that the organic luminescent element is completely sealed in an airtight space 1109. The airtight space 1109 is filled with inert gas (typically, nitrogen gas or noble gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound layer from being reflected at the polarizing plate and traveling backward.

Any of organic luminescent elements according to the present invention can be used as the organic luminescent element included in the luminescent device of this embodiment.

EMBODIMENT 7

Figure 19:
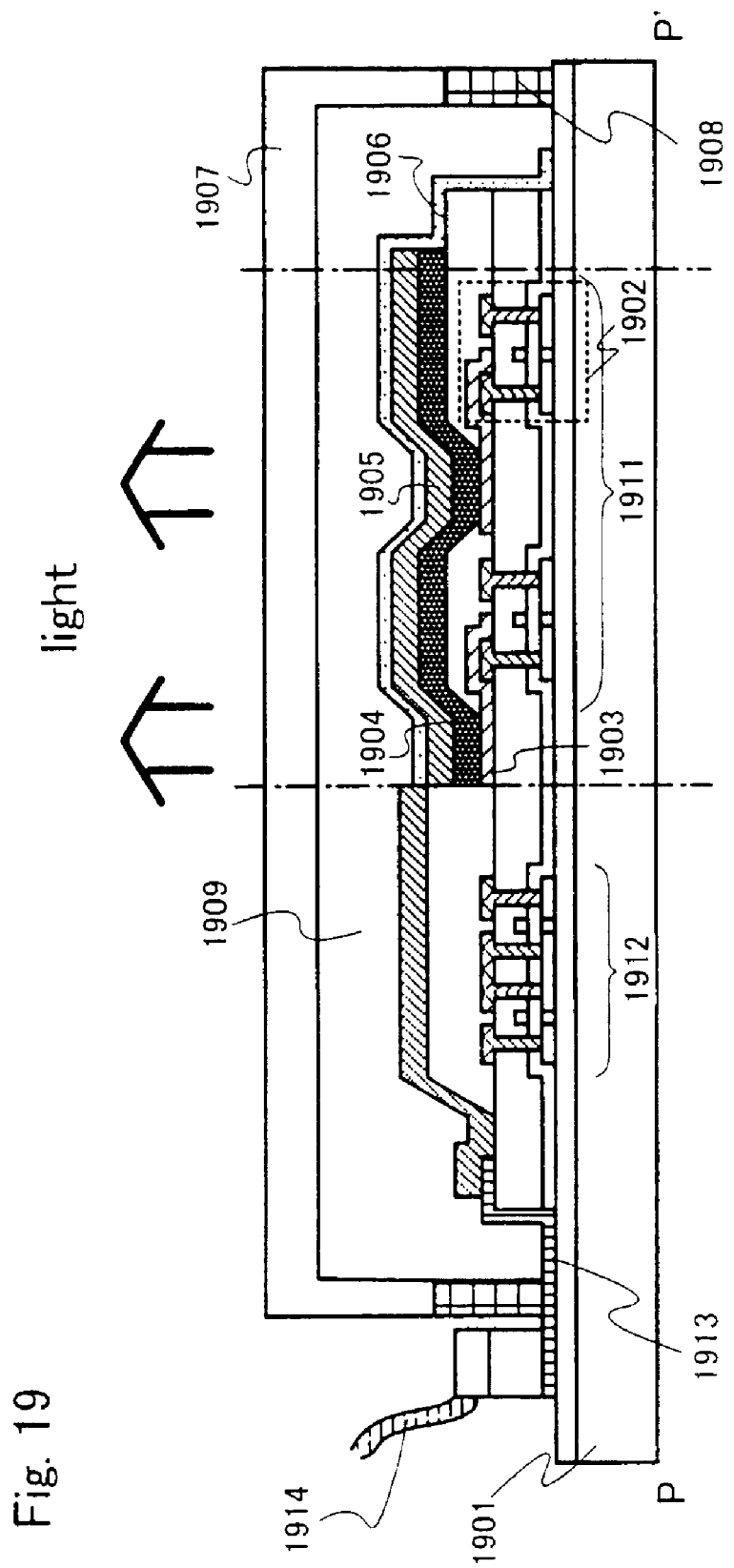
FIG. 19 is a diagram showing the cross-sectional structure of a luminescent device.

This embodiment shows an active matrix luminescent device as an example of a luminescent device that includes an organic luminescent element according to the present invention. Unlike Embodiment 6, in the luminescent device of this embodiment, light is taken out from the opposite side of a substrate on which an active element is formed (hereinafter referred to as upward emission). FIG. 19 is a sectional view thereof.

A thin film transistor (hereinafter referred to as TFT) is used here as the active element, but the active element may be a MOS transistor. The TFT shown as an example is a top gate TFT (planar TFT, to be specific), but a bottom gate TFT (typically a reverse stagger TFT) may be used instead.

A substrate 1901, a current controlling TFT 1902 that is formed in a pixel portion, and a driving circuit 1912 of this embodiment have the same structure as those of Embodiment 6.

A first electrode 1903, which is connected to a drain of the current controlling TFT 1902, is used as an anode in this embodiment, and therefore is formed preferably from a conductive material having a large work function. Typical examples of the conductive material include metals such as nickel, palladium, tungsten, gold, and silver. In this embodiment, the first electrode 1903 desirably does not transmit light. More desirably, the electrode is formed from a material that is highly reflective of light.

On the first electrode 1903, an organic compound film 1904 is formed. Provided on the organic compound film 1904 is a second electrode 1905, which serves as a cathode in this embodiment. Accordingly, the material of the second electrode 1905 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 1905. Therefore, when used for the second electrode, the metal is preferably formed into a very thin film about 20 nm in thickness.

A layer composed of the first electrode 1903, the organic compound film 1904, and the second electrode 1905, are covered with a protective film 1906. The protective film 1906 is provided to protect the organic luminescent element from oxygen and moisture. In this embodiment, any material can be used for the protective film as long as it transmits light.

The first electrode (anode) 1903 is electrically connected to the current controlling TFT 1902 in FIG. 19 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 1907 is a cover member and is bonded with a seal member 1908 formed of a resin. The cover member 1907 may be any material as long as it transmits light but not oxygen and water. In this embodiment, glass is used. An airtight space 1909 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 1914 through an input wiring line 1913. Though not shown in the drawing, the TAB tape 1414 may be replaced by a TCP (tape carrier package) that is obtained by providing a TAB tape with an IC (integrated circuit).

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic luminescent elements according to the present invention can be used as the organic luminescent element included in the luminescent device of this embodiment.

EMBODIMENT 8

Figure 12A:
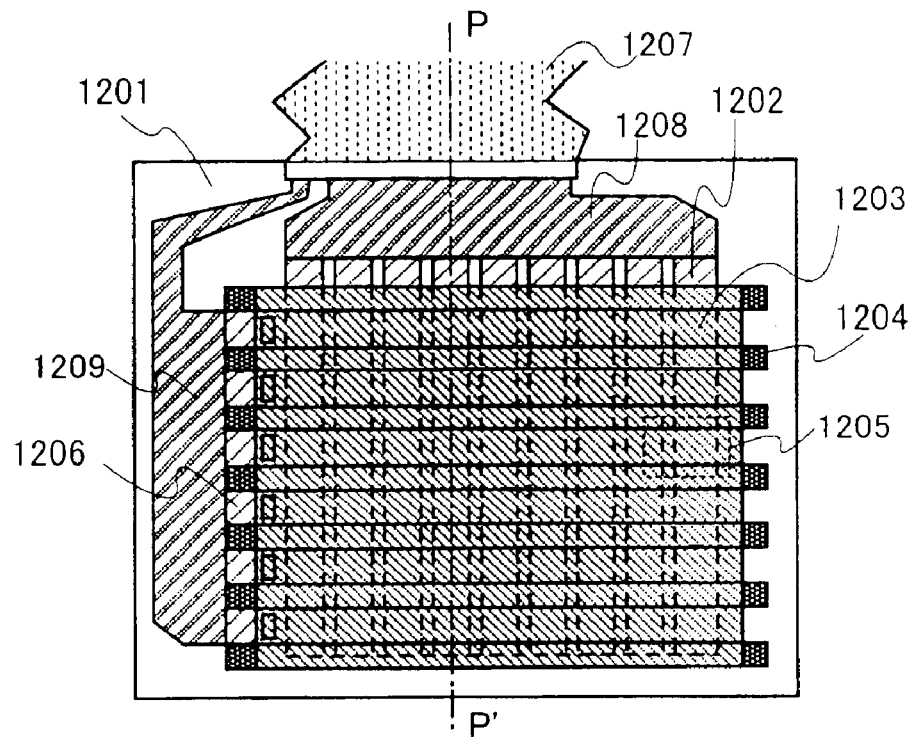
FIGS. 12A through 12C are diagrams showing the top structure and the cross-sectional structures of a luminescent device.
Figure 12B:
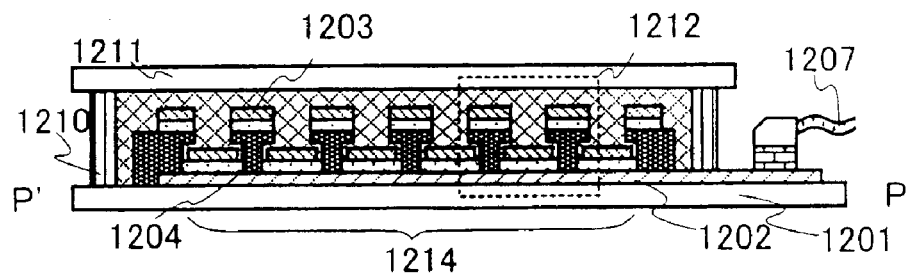

This embodiment shows a passive matrix luminescent device as an example of a luminescent device that includes an organic luminescent element disclosed in the present invention. FIG. 12A is a top view thereof and FIG. 12B is a sectional view taken along the line P-P' of FIG. 12A.

In FIG. 12A, denoted by 1201 is a substrate, which is formed of a plastic material here. The plastic material, which can be used, is a plate or film of polyimide, polyamide, an acrylic resin, an epoxy resin, PES (polyethylene sulfile), PC (polycarbonate), PET (polyethylene terephthalate), or PEN (polyethylene naphthalate).

1202 denotes scanning lines (anodes) formed from a conductive oxide film. In this embodiment, the conductive oxide film is obtained by doping zinc oxide with gallium oxide. 1203 denotes data lines (cathodes) formed from a metal film, a bismuth film, in this embodiment. 1204 denotes banks formed of an acrylic resin. The banks function as partition walls that separate the data lines 1203 from one another. The scanning lines 1202 and the data lines 1203 respectively form stripe patterns and the patterns cross each other at right angles. Though not shown in FIG. 12A, an organic compound film is sandwiched between the scanning lines 1202 and the data lines 1203 and intersection portions 1205 serve as pixels.

The scanning lines 1202 and the data lines 1203 are connected to an external driving circuit through a TAB tape 1207. 1208 denotes a group of wiring lines comprised of a mass of the scanning lines 1202. 1209 denotes a group of wiring lines comprised of a mass of connection wiring lines 1206 that are connected to the data lines 1203. Though not shown, the TAB tape 1207 may be replaced by TCP that is obtained by providing a TAB tape with an IC.

In FIG. 12B, 1210 denotes a seal member and 1211 denotes a cover member that is bonded to a plastic member 1201 with the seal member 1210. A photo-curable resin can be used for the seal member 1210. A preferable material of the seal member is one which allows little gas leakage and which absorbs little moisture. The cover member is preferably made from the same material as the substrate 1201, and glass (including quartz glass) or plastic can be used. Here, a plastic material is used for the cover member.

Figure 12C:
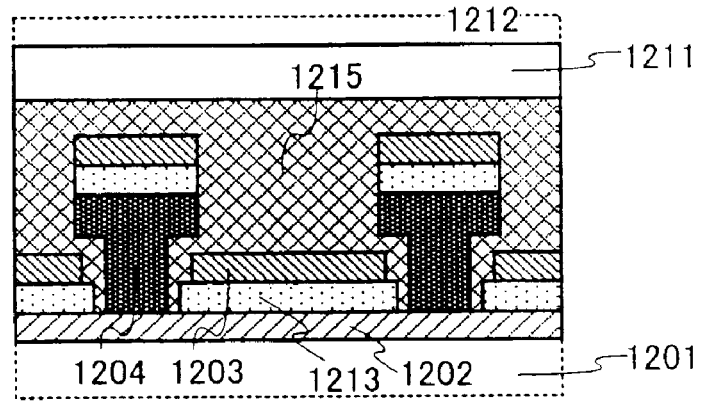

FIG. 12C is an enlarged view of the structure of a pixel region. 1213 denotes an organic compound layer. Lower layers of the banks 1204 are narrower than upper layers and therefore the banks can physically separate the data lines 1203 from one another. A pixel portion 1214 surrounded by the seal member 1210 is shut off of the outside air by a sealing member 1215 formed of a resin. Degradation of the organic compound film is thus prevented.

In the luminescent device structured as above in accordance with the present invention, the pixel portion 1214 is composed of the scanning lines 1202, the data lines 1203, the banks 1204, and the organic compound film 1213. Therefore the luminescent device can be manufactured by a very simple process.

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic luminescent elements according to the present invention can be used as the organic luminescent element included in the luminescent device of this embodiment.

EMBODIMENT 9

This embodiments shows an example of attaching a printed wiring board to the luminescent device shown in Embodiment 8 to make the device into a module.

Figure 13A:
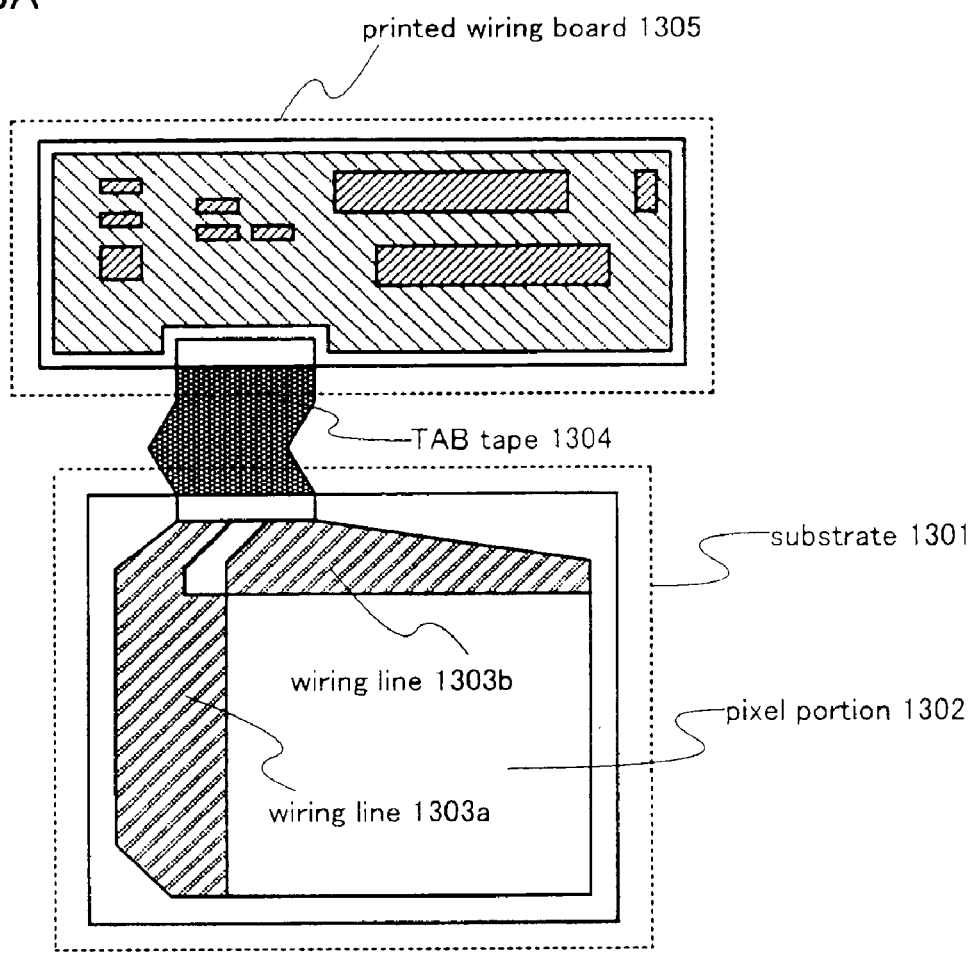
FIGS. 13A and 13B are diagrams illustrating the structure of a luminescent device.

In a module shown in FIG. 13A, a TAB tape 1304 is attached to a substrate 1301 (here including a pixel portion 1302 and wiring lines 1303a and 1303b), and a printed wiring board 1305 is attached to the substrate through the TAB tape 1304.

Figure 13B:
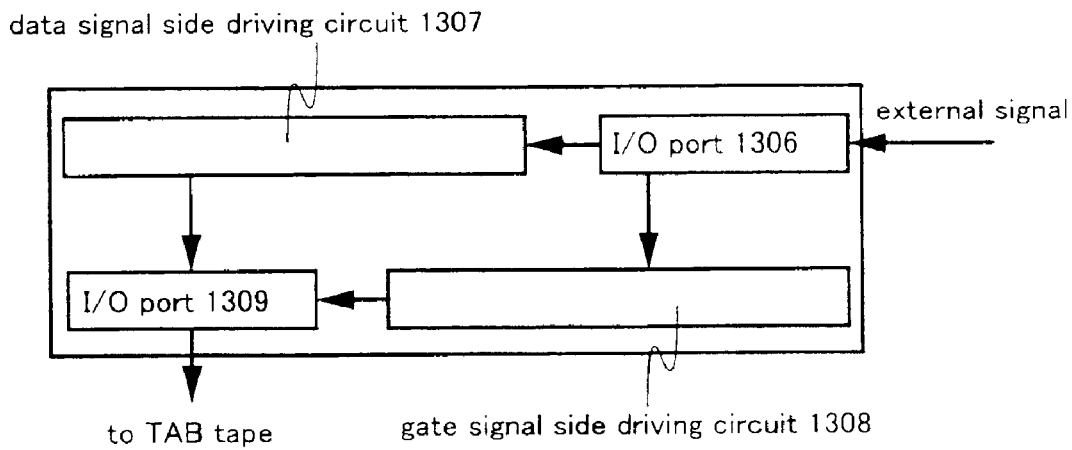

A functional block diagram of the printed wiring board 1305 is shown in FIG. 13B. An IC functioning as at least I/O ports (input or output portions) 1306 and 1309, a data signal side driving circuit 1307, and a gate signal side driving circuit 1308 are provided within the printed wiring board 1305.

In this specification, a module structured by attaching a TAB tape to a substrate with a pixel portion formed on its surface and by attaching a printed wiring board that functions as a driving circuit to the substrate through the TAB tape as above is specially named a module with external driving circuit.

Any of organic luminescent elements disclosed in the present invention can be used as the organic luminescent element included in the luminescent device of this embodiment.

EMBODIMENT 10

This embodiment shows an example of attaching a printed wiring board to the luminescent device shown in Embodiment 6, 7, or 8 to make the device into a module.

Figure 14A:
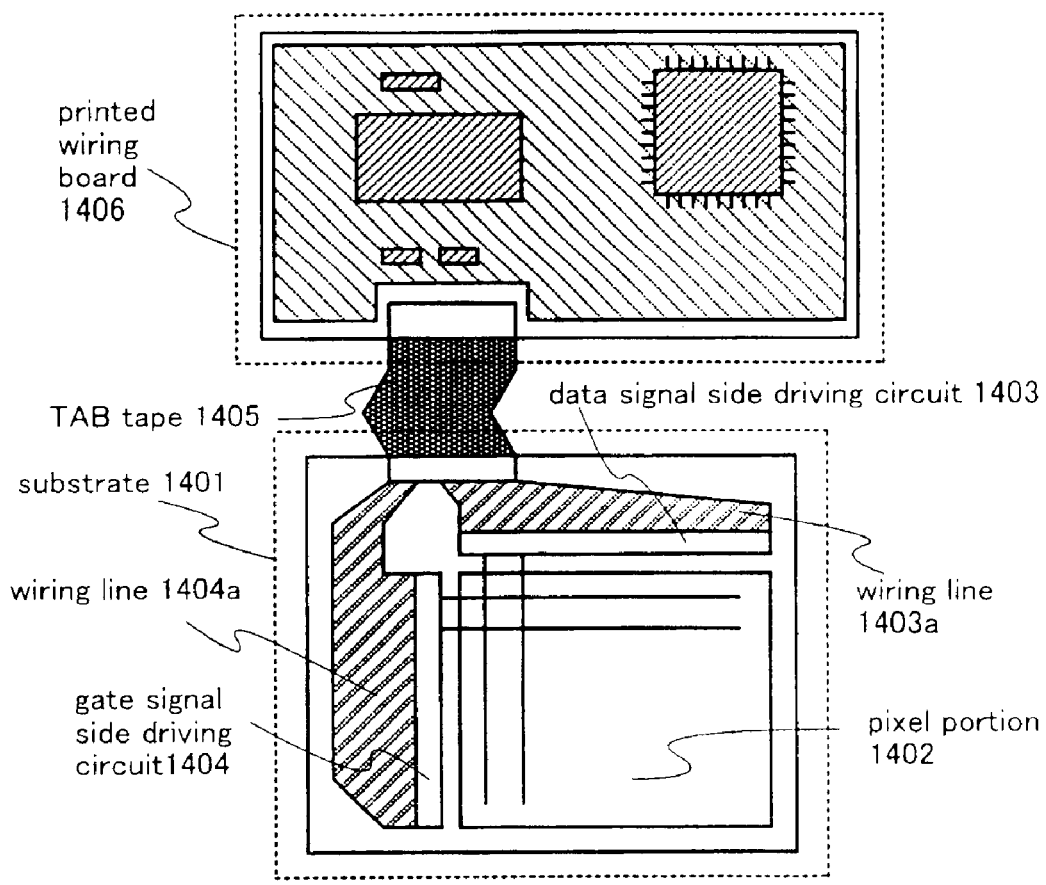
FIGS. 14A and 14B are diagrams illustrating the structure of a luminescent device.

In a module shown in FIG. 14A, a TAB tape 1405 is attached to a substrate 1401 (here including a pixel portion 1402, a data signal side driving circuit 1403, a gate signal side driving circuit 1404, and wiring lines 1403a and 1404a), and a printed wiring board 1406 is attached to the substrate through the TAB tape 1405. A functional block diagram of the printed wiring board 1406 is shown in FIG. 14B.

Figure 14B:
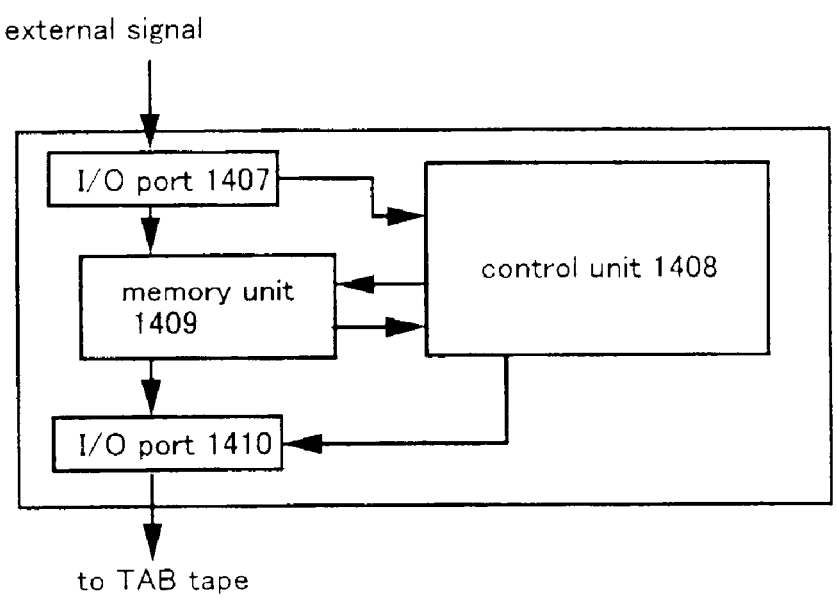

As shown in FIG. 14B, an IC functioning as at least I/O ports 1407 and 1410 and a control unit 1408 is provided within the printed wiring board 1406. A memory unit 1409 is provided here but it is not always necessary. The control unit 1408 is a portion having functions for controlling the driving circuits and correction of image data.

In this specification, a module structured by attaching a printed wiring board that has functions as a controller to a substrate on which an organic luminescent element is formed as above is specially named a module with external controller.

Any of organic luminescent elements disclosed in the present invention can be used as the organic luminescent element included in the luminescent device of this embodiment.

EMBODIMENT 11

This embodiment shows an example of luminescent device in which an organic luminescent element shown in the present invention is driven at constant voltage in accordance with digital time gray scale display.

Figure 17A:
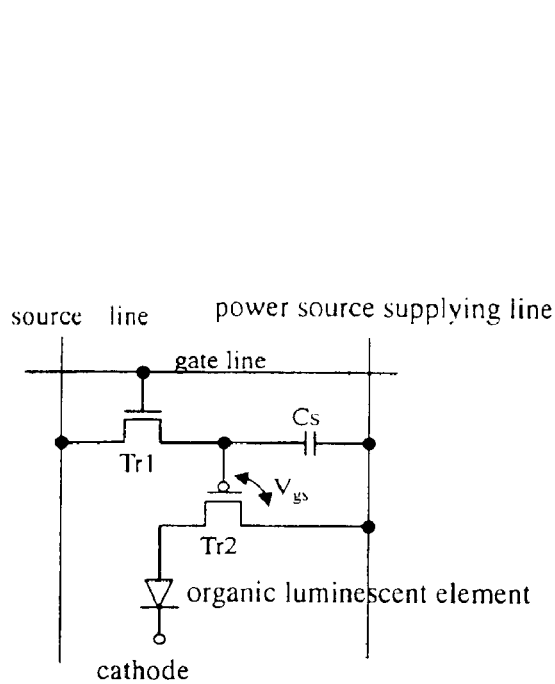
FIGS. 17A through 17C are diagrams showing the circuit structure of a luminescent device.

FIG. 17A shows the circuit structure of a pixel that uses an organic luminescent element. Tr represents a transistor and Cs represents a storage capacitor. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic luminescent element.

After Tr1 is selected, Tr1 is turned OFF to hold the voltage ($V_{gs}$) of Cs. Accordingly, a current continues to flow in an amount dependent of $V_{gs}$.

Figure 17C:
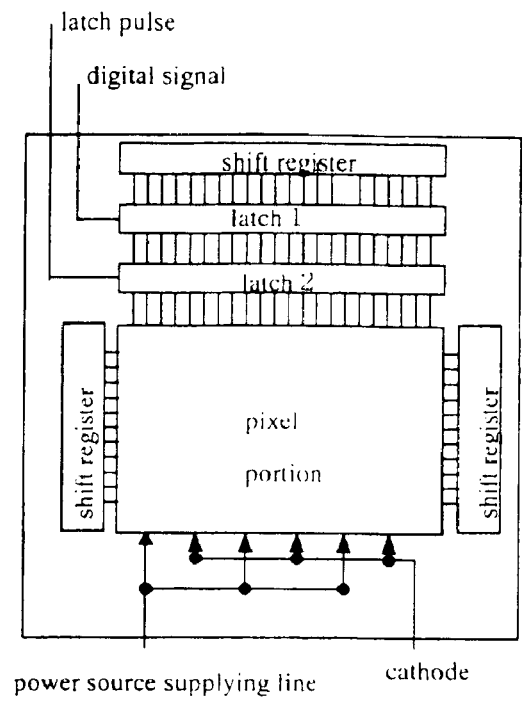
Figure 17B:
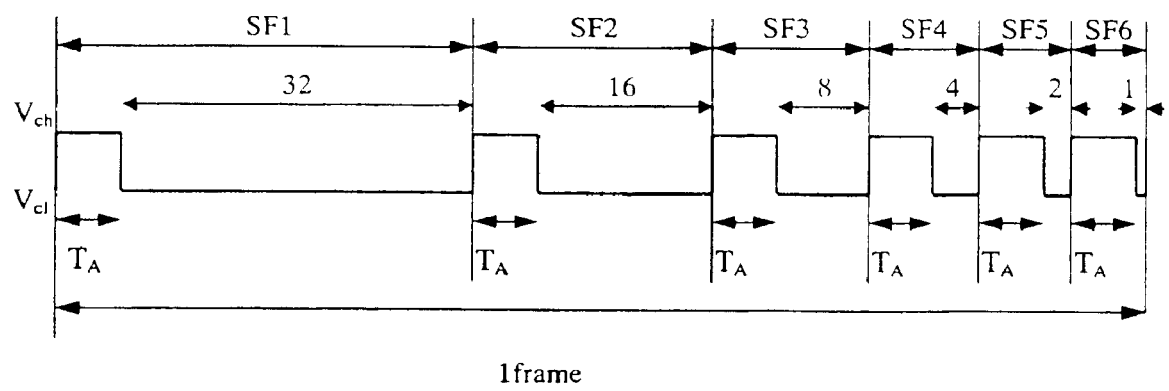

FIG. 17B shows a chart for driving this circuit in accordance with digital time gray scale display. In digital time gray scale display, one frame is divided into plural sub-frames. FIG. 17B shows 6 bit gray scale in which one frame is divided into six sub-frames. In this case, the ratio of light emission periods of the sub-frames is 32:16:8:4:2:1.

FIG. 17C schematically shows driving circuits of TFT substrate in this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

EMBODIMENT 12

The following description of the embodiment illustrates an example of a constant drive circuit of an active matrix type which drives the organic luminescent devices of the invention by supplying a constant current thereto. The circuit structure is shown in FIG. 18.

Figure 18:
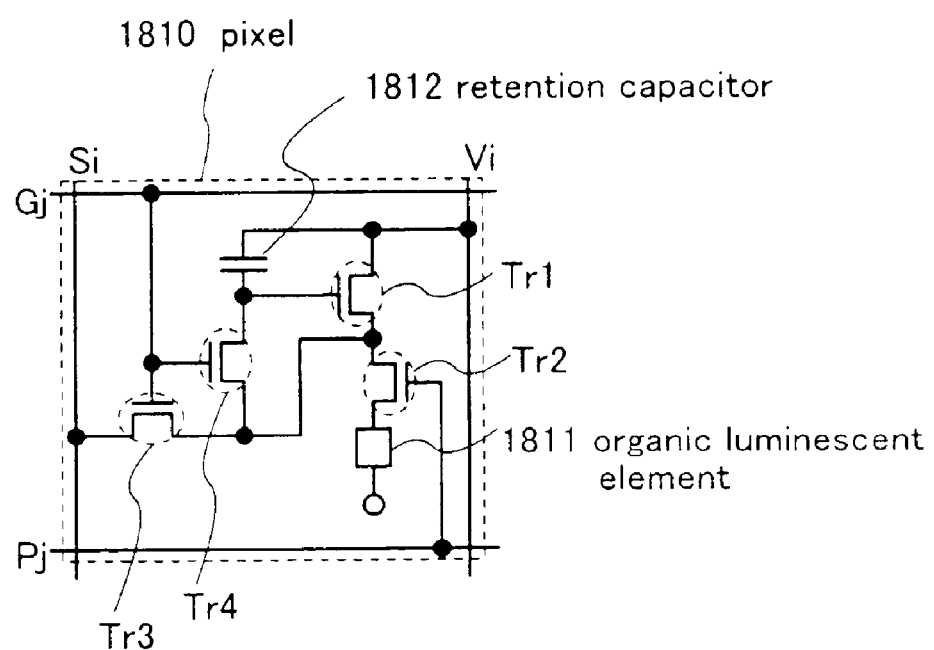
FIG. 18 is a diagram showing the circuit structure of luminescent device.

A pixel 1810 shown in FIG. 18 has a signal line Si, a first scan line Gj, a second scan line Pj and a power supply line Vi. The pixel 1810 further has transistors Tr1, Tr2, Tr3 and Tr4, a mixed junction type organic luminescent device 1811 and a retaining capacitor 1812.

The gates of the transistors Tr3 and Tr4 are both connected to the first scan line Gj. One of the source and drain of the transistor Tr3 is connected to the signal line Si and the other to the source of the transistor Tr2. One of the source and drain of the transistor Tr4 is connected to the source of the transistor Tr2 and the other to the gate of the transistor Tr1. That is, one of the source and drain of the transistor Tr3 is connected to one of the source and drain of the transistor Tr4.

The source of Tr1 is connected with the power source line Vi and the drain of Tr1 is connected with the source of Tr2. The gate of Tr2 is connected to the second scanning line Pj. And, the drain of the Tr2 is connected with a pixel electrode in the organic luminescent element 1811. The organic luminescent element 1811 has the pixel electrode, a counter electrode and an organic luminescent layer provided between the pixel electrode and the counter electrode. The counter electrode of the organic luminescent element 1811 is applied constant voltage by a power source provided at the external of a light emitting panel.

Tr3 and Tr4 can adopt both n-channel type TFT and p-channel type TFT. However, the polarities of Tr3 and Tr4 are the same. Further, Tr1 can adopt both n-channel type TFT and p-channel type TFT. Tr2 can adopt both n-channel type TFT and p-channel type TFT. With respect to the polarity, in the case of the pixel electrode and the counter electrode in the organic luminescent element, the one is an anode and the other is a cathode. In the case that the Tr2 is an p-channel type TFT, it is preferable to use the anode as a pixel electrode, and the cathode as a counter electrode. Reversely, in the case that the Tr2 is an n-channel type TFT, it is preferable to use the cathode as a pixel electrode, and the anode as a counter electrode.

The retention capacitor 1812 is formed between the gate and the source of Tr1. The retention capacitor 1812 is provided to maintain more certainly the voltage ($V_{GS}$) between the gate and the source of Tr1. However, it is not necessary always provided.

In the pixel shown in FIG. 37, the current supplied to the signal line Si is controlled at the current source in the signal line driving circuit.

By applying the above-mentioned circuit structure, the constant-current driving can be realized, by which the brightness can be kept by flowing a constant current in the organic luminescent element. The organic luminescent element having a mixed region of the present invention has a longer lifetime than that of prior organic luminescent element. The organic luminescent element is effective because very longer lifetime can be realized by implementing above-mentioned constant-current driving.

The invention is practiced to enable providing a luminescent device which is small in power consumption and excellent in life. Further, an electric appliance, which is bright and small in power consumption and serviceable over a long term, can be obtained by using such luminescent device for a light source or a display section.

EMBODIMENT 13

The luminescent devices of the present invention, which have been described in, the embodiments above have advantages of low power consumption and long lifetime. Accordingly, electric appliances that include those luminescent devices as their display units can operate consuming less power than conventional ones and are durable. The advantages are very useful especially for electric appliances that use batteries as power sources, such as portable equipment, because low power consumption leads directly to conveniences (batteries last longer).

The luminescent device is self-luminous to eliminate the need for back light as the one in liquid crystal displays, and has an organic compound layer whose thickness is less than 1 μm. Therefore the luminescent device can be made thin and light-weight. Electric appliances that include the luminescent device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported) and installation (space-saving in a room).

Being self-luminous, the luminescent device is characterized by having better visibility in bright places than liquid crystal display devices and wide viewing angle. Therefore electric appliances that include the luminescent device as their display units are very advantageous also in terms of easiness in viewing display.

To summarize, electric appliances that use a luminescent device of the present invention have, in addition to merits of conventional organic luminescent elements, namely, thinness/lightness and high visibility, new features of low power consumption and long lifetime, and therefore are very useful.

This embodiment shows examples of the electric appliances that include as display units the luminescent device of the present invention. Specific examples thereof are shown in FIGS. 15 and 16. Any metal complexes disclosed in the present invention can be used for the organic luminescent element included in the electric appliance of this embodiment. The luminescent device included in the electric appliance of this embodiment can have any of the configurations illustrated in FIGS. 8 to 14.

Figure 15A:
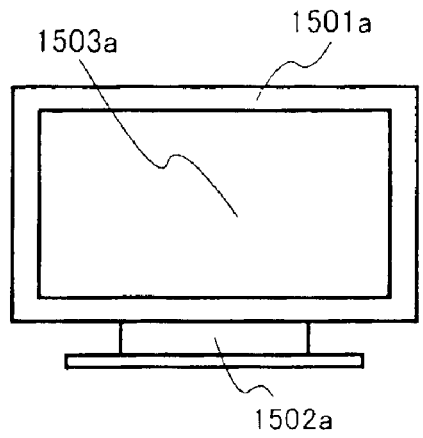
FIGS. 15A through 15F are diagrams showing specific examples of electric appliances.

FIG. 15A shows a display device using an organic luminescent element. The display device is composed of a case 1501a, a support base 1502a, and a display unit 1503a. By using a luminescent device of the present invention as the display unit 1703a, the display device can be thin, light-weight, and durable. Accordingly, transportation is simplified, space is saved in installation, and lifetime is long.

Figure 15B:
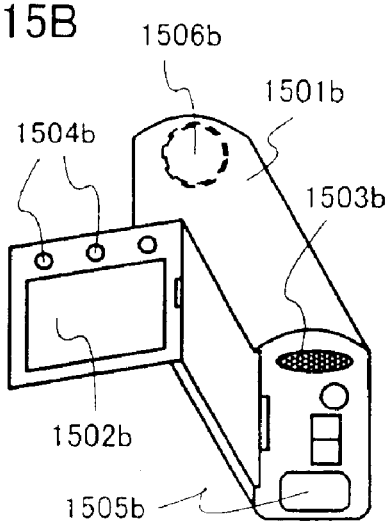

FIG. 15B shows a video camera, which is composed of a main body 1501b, a display unit 1502b, an audio input unit 1503b, operation switches 1504b, a battery 1505b, and an image receiving unit 1506b. By using a luminescent device of the present invention as the display unit 1502b, the video camera can be light-weight and consumes less power. Accordingly, battery consumption is reduced and carrying the video camera is less inconvenient.

Figure 15C:
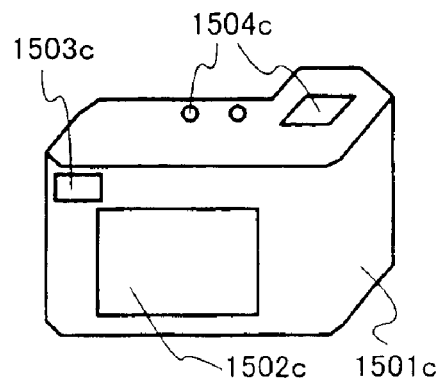

FIG. 15C shows a digital camera, which is composed of a main body 1501c, a display unit 1502c, an eye piece unit 1503c, and operation switches 1504c. By using a luminescent device of the present invention as the display unit 1502c, the digital camera can be light-weight and consumes less power. Accordingly, battery consumption is reduced and carrying the digital camera is less inconvenient.

Figure 15D:
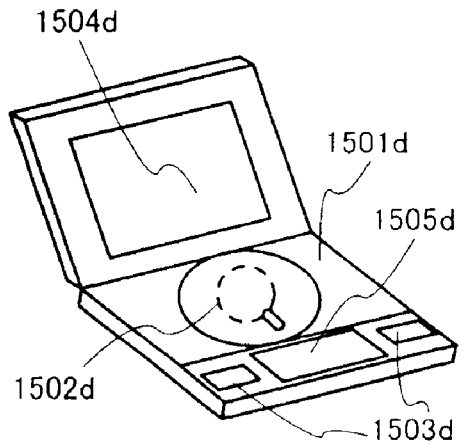

FIG. 15D shows an image reproducing device equipped with a recording medium. The device is composed of a main body 1501d, a recording medium (such as CD, LD, or DVD) 1502d, operation switches 1503d, a display unit (A) 1504d, and a display unit (B) 1505d. The display unit (A) 1504d mainly displays image information whereas the display unit (B) 1505d mainly displays text information. By using a luminescent device of the present invention as the display unit (A) 1504d and the display unit (B) 1505d, the image reproducing device consumes less power and can be light-weight and durable. The image reproducing device equipped with a recording medium also includes CD players and game machines.

Figure 15E:
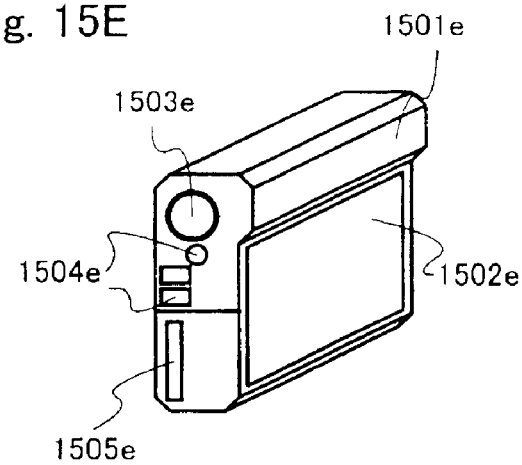

FIG. 15E shows a (portable) mobile computer, which is composed of a main body 1501e, a display unit 1502e, an image receiving unit 1503e, operation switches 1504e, and a memory slot 1505e. By using a luminescent device of the present invention as the display unit 1502e, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 15F:
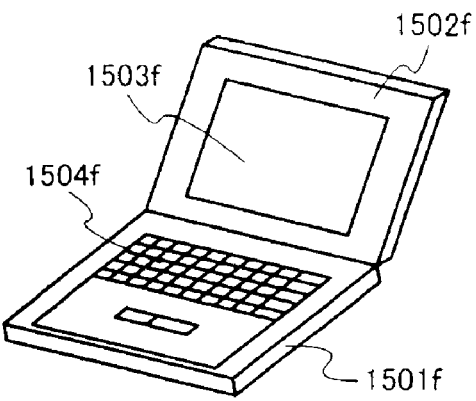

FIG. 15F shows a personal computer, which is composed of a main body 1501f, a case 1502f, a display unit 1503f, and a keyboard 1504f. By using a luminescent device of the present invention as the display unit 1503f, the personal computer can be thin and light-weight, and consumes less power. The luminescent device is a great merit in terms of battery consumption and lightness especially for a notebook personal computer that are carried around.

These electric appliances now display with increasing frequency information sent through electronic communication lines such as the Internet and radio communications such as radio wave, especially, animation information. Since organic luminescent elements have very fast response speed, the luminescent device is suitable for animation display.

Figure 16A:
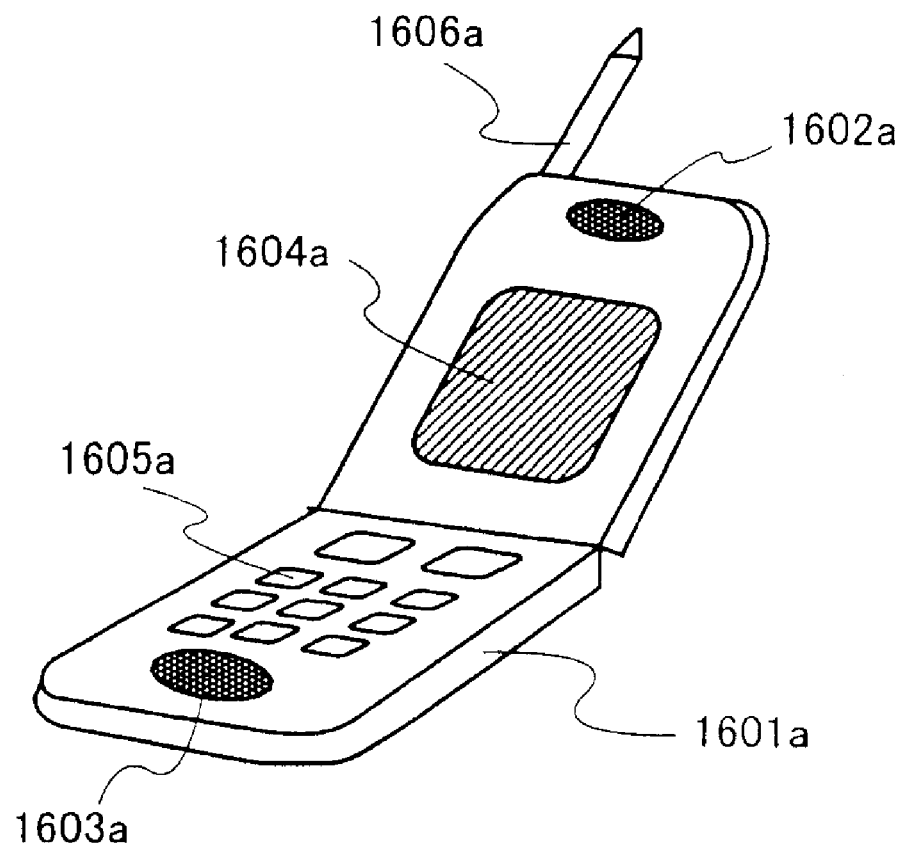
FIGS. 16A and 16B are diagrams showing specific examples of electric appliances.

FIG. 16A shows a cellular phone, which is composed of a main body 1601a, an audio output unit 1602a, an audio input unit 1603a, a display unit 1604a, operation switches 1605a, and an antenna 1606a. By using a luminescent device of the present invention as the display unit 1604a, the cellular phone can be thin and light-weight, and consumes less power. Accordingly, battery consumption is reduced, carrying the cellular phone is easy, and the main body is compact.

Figure 16B:
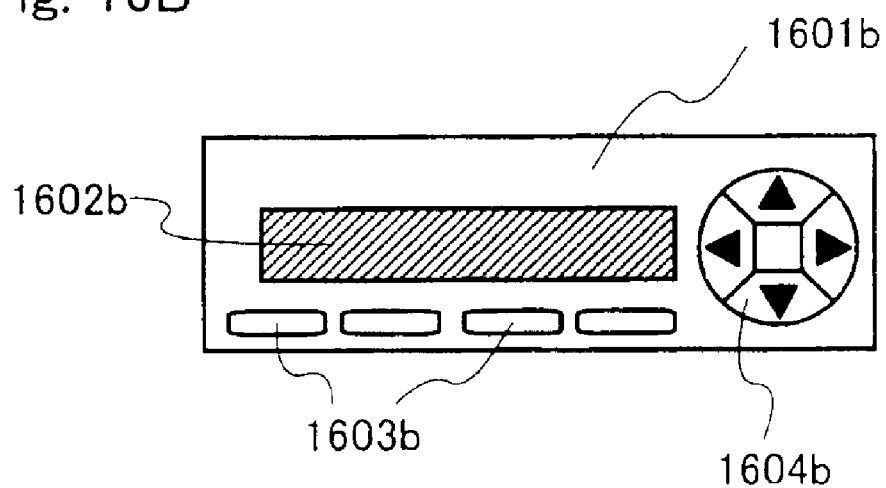

FIG. 16B shows audio (specifically, car audio), which is composed of a main body 1601b, a display unit 1602b, and operation switches 1603b and 1604b. By using a luminescent device of the present invention as the display unit 1602b, the audio can be light-weight, and consumes less power. Although car audio is taken as an example in this embodiment, the audio may be home audio.

It is effective to give the electric appliances shown in FIGS. 15A to 15F to 16A to 16B a function of modulating the luminance of emitted light in accordance with the brightness of the surroundings where the electric appliances are used by providing the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the luminescent device of the present invention can be also thin and light-weight and can operate consuming less power, which makes them very useful appliances. Light sources of liquid crystal display devices, such as back light or front light, or light sources of lighting fixtures are included in the luminescent device of the present invention as a light source. Accordingly, the luminescent device can be thin, light-weight, and consume less power.

When liquid crystal displays are used as the display units of the electric appliances shown in FIGS. 15A to 15F and 17A to 17B according to this embodiment, the electric appliances can be thin and light-weight and consume less power if those liquid crystal displays use as back light or front light the luminescent device of the present invention.

The invention is practiced to enable providing a luminescent device which is small in power consumption and excellent in life. Further, an electric appliance, which is bright and small in power consumption and serviceable over a long term, can be obtained by using such luminescent device for a light source or a display section.

What is claimed is:

1. A method for manufacturing a light emitting device comprising:
   forming a bank;
   forming a high-molecular organic compound layer comprising a solvent in which the high-molecular organic compound is dissolved adjacent to the bank, over an electrode by an ink-jet method;
   forming a low-molecular organic compound layer over the high-molecular organic compound layer comprising the solvent by vacuum evaporation; and
   heating the solvent to remove the solvent, thereby forming a mixed region comprising the high-molecular organic compound and the low-molecular organic compound, after forming the low-molecular organic compound layer.

2. The method for the manufacturing a light emitting device according to claim 1, wherein the high-molecular organic compound layer includes π electrons and is chemically doped.

3. The method for manufacturing a light emitting device according to claim 1, wherein the high-molecular organic compound layer includes an organic compound selected from the group consisting of polythiophene derivative, a polyaniline derivative and a polyvinylcarbazole derivative.

4. The method for manufacturing a light emitting device according to claim 1, wherein the high-molecular organic compound layer includes an organic compound selected from the group consisting of polyparaphenylenevinylene derivative, a polydialkylfluorene derivative, and a polyphenylene derivative.

5. The method for manufacturing a light emitting device according to claim 1, wherein the low-molecular organic compound layer includes an $Alq_3$.

6. The method of manufacturing a light emitting device according to claim 1, wherein said heating is carried out under a reduced pressure of $10^{-4}$ Pa or lower.

7. A method for manufacturing a light emitting device comprising:
   forming a bank;
   forming a luminescent compound layer having a high-molecular organic compound layer comprising a solvent in which the high-molecular organic compound is dissolved adjacent to the bank, over an electrode by an ink-jet method;
   forming an electron transporting layer having a low-molecular organic compound layer over the high-molecular organic compound layer comprising the solvent by vacuum evaporation; and
   heating the solvent to remove the solvent, thereby forming a mixed region comprising the high-molecular organic compound and the low-molecular organic compound, after forming the low-molecular organic compound layer.

8. The method for the manufacturing a light emitting device according to claim 7, wherein the high-molecular organic compound layer includes π electrons and is chemically doped.

9. The method for manufacturing a light emitting device according to claim 7, wherein the high-molecular organic compound layer includes an organic compound selected from the group consisting of polythiophene derivative, a polyaniline derivative and a polyvinylcarbazole derivative.

10. The method for manufacturing a light emitting device according to claim 7, wherein the high-molecular organic compound layer includes an organic compound selected from the group consisting of polyparaphenylenevinylene derivative, a polydialkylfluorene derivative, and a polyphenylene derivative.

11. The method for manufacturing a light emitting device according to claim 7, wherein the low-molecular organic compound layer includes an $Alq_3$.

12. The method of manufacturing a light emitting device according to claim 7, wherein said heating is carried out under a reduced pressure of $10^{-4}$ Pa or lower.

13. A method for manufacturing a light emitting device comprising:
   forming a thin film transistor over a substrate;
   forming an interlayer insulating film over the thin film transistor;
   forming a first electrode over the interlayer insulating film;
   forming a bank over the interlayer insulating film and the first electrode;
   forming a high-molecular organic compound layer comprising a solvent in which the high-molecular organic compound is dissolved adjacent to the bank, over the first electrode by an ink-jet method;
   forming a low-molecular organic compound layer over the high-molecular organic compound layer comprising the solvent by vacuum evaporation;
   heating the substrate to remove the solvent, thereby forming a mixed region comprising the high-molecular organic compound and the low-molecular organic compound, after forming the low-molecular organic compound layer; and
   forming a second electrode over the low-molecular organic compound layer.

14. The method for the manufacturing a light emitting device according to claim 13, wherein the high-molecular organic compound layer includes π electrons and is chemically doped.

15. The method for manufacturing a light emitting device according to claim 13, wherein the high-molecular organic compound layer includes an organic compound selected from the group consisting of polythiophene derivative, a polyaniline derivative and a polyvinylcarbazole derivative.

16. The method for manufacturing a light emitting device according to claim 13, wherein the high-molecular organic compound layer includes an organic compound selected from the group consisting of polyparaphenylenevinylene derivative, a polydialkylfluorene derivative, and a polyphenylene derivative.

17. The method for manufacturing a light emitting device according to claim 13, wherein the substrate is selected from the group consisting of a glass substrate, a quartz substrate, a crystal glass substrate, and a plastic substrate.

18. The method for manufacturing a light emitting device according to claim 13, wherein the first electrode has at least one of a material selected from the group consisting of indium oxide, tin oxide, zinc oxide, indium tin oxide, an alkaline metal element, an alkaline-earth metal element, a conductive film containing aluminum, and a conductive film containing silver.

19. The method for manufacturing a light emitting device according to claim 13, wherein the second electrode has at least one of a material selected from the group consisting of indium oxide, tin oxide, zinc oxide, indium tin oxide, an alkaline metal element, an alkaline-earth metal element, a conductive film containing aluminum, and a conductive film containing silver.

20. The method for manufacturing a light emitting device according to claim 13, wherein the low-molecular organic compound layer includes an $Alq_3$.

21. The method of manufacturing a light emitting device according to claim 13, wherein said heating is carried out under a reduced pressure of $10^{-4}$ Pa or lower.

22. A method for manufacturing a light emitting device comprising:

forming a thin film transistor over a substrate;

forming an interlayer insulating film over the thin film transistor;

forming a first electrode over the interlayer insulating film;

forming a bank over the interlayer insulating film and the first electrode;

forming a luminescent compound layer having a high-molecular organic compound layer comprising a solvent in which the high-molecular organic compound is dissolved adjacent to the bank, over the first electrode by an ink-jet method;

forming an electron transporting layer having a low-molecular organic compound layer over the high-molecular organic compound layer comprising the solvent by vacuum evaporation;

heating the substrate to remove the solvent, thereby forming a mixed region comprising the high-molecular organic compound and the low-molecular organic compound, after forming the low-molecular organic compound layer; and forming a second electrode over the low-molecular organic compound layer.

23. The method for the manufacturing a light emitting device according to claim 22, wherein the high-molecular organic compound layer includes $\pi$ electrons and is chemically doped.

24. The method for manufacturing a light emitting device according to claim 22, wherein the high-molecular organic compound layer includes an organic compound selected from the group consisting of polythiophene derivative, a polyaniline derivative and a polyvinylcarbazole derivative.

25. The method for manufacturing a light emitting device according to claim 22, wherein the high-molecular organic compound layer includes an organic compound selected from the group consisting of polyparaphenylenevinylene derivative, a polydialkylfluorene derivative, and a polyphenylene derivative.

26. The method for manufacturing a light emitting device according to claim 22, wherein the substrate is selected from the group consisting of a glass substrate, a quartz substrate, a crystal glass substrate, and a plastic substrate.

27. The method for manufacturing a light emitting device according to claim 22, wherein the first electrode has at least one of a material selected from the group consisting of indium oxide, tin oxide, zinc oxide, indium tin oxide, an alkaline metal element, an alkaline-earth metal element, a conductive film containing aluminum, and a conductive film containing silver.

28. The method for manufacturing a light emitting device according to claim 22, wherein the second electrode has at least one of a material selected from the group consisting of indium oxide, tin oxide, zinc oxide, indium tin oxide, an alkaline metal element, an alkaline-earth metal element, a conductive film containing aluminum, and a conductive film containing silver.

29. The method for manufacturing a light emitting device according to claim 22, wherein the low-molecular organic compound layer includes an $Alq_3$.

30. The method of manufacturing a light emitting device according to claim 22, wherein said heating is carried out under a reduced pressure of $10^{-4}$ Pa or lower.

* * * * *